US012795995B2

(12) United States Patent
Lee et al.

(10) Patent No.: US 12,795,995 B2
(45) Date of Patent: Nov. 10, 2026

(54) SEMICONDUCTOR DEVICES

(71) Applicant: SAMSUNG ELECTRONICS CO., LTD., Suwon-si (KR)

(72) Inventors: Doohyun Lee, Suwon-si (KR); Heonjong Shin, Suwon-si (KR); Seonbae Kim, Suwon-si (KR); Jinyoung Park, Suwon-si (KR); Hyunho Park, Suwon-si (KR); Jimin Yu, Suwon-si (KR); Jaeran Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 995 days.

(21) Appl. No.: 18/085,331

(22) Filed: Dec. 20, 2022

(65) Prior Publication Data

US 2023/0231023 A1 Jul. 20, 2023

(30) Foreign Application Priority Data

Apr. 18, 2022 (KR) ........................ 10-2022-0047647

(51) Int. Cl.
*H10D 30/67* (2025.01)
*H10D 30/01* (2025.01)
(Continued)

(52) U.S. Cl.
CPC ....... *H10D 30/6729* (2025.01); *H10D 30/014* (2025.01); *H10D 30/43* (2025.01);
(Continued)

(58) Field of Classification Search
None
See application file for complete search history.

(56) References Cited

U.S. PATENT DOCUMENTS 10,008,497 B2 6/2018 Lee et al.
10,121,702 B1 11/2018 Park et al.
(Continued)

FOREIGN PATENT DOCUMENTS

KR 1994-0010199 A 5/1994
TW 201830497 A 8/2018

OTHER PUBLICATIONS

Communication issued on Sep. 20, 2023 by the European Patent Office for European Patent Application No. 23153813.3.
(Continued)

*Primary Examiner* — Steven B Gauthier
*Assistant Examiner* — Lamont B Koo
(74) *Attorney, Agent, or Firm* — Sughrue Mion, PLLC

(57) ABSTRACT

A semiconductor device includes a substrate, active regions extending in a first horizontal direction on the substrate, and including first and second active regions spaced apart from each other in a second horizontal direction perpendicular to the first horizontal direction, and third and fourth active regions spaced apart from each other in the second horizontal direction, first to fourth source/drain regions on the first to fourth active regions, first to fourth contact plugs connected to the first to fourth source/drain regions, a first isolation insulating pattern disposed between the first and second contact plugs, and a second isolation insulating pattern disposed between the third and fourth contact plugs, wherein a first length of the first isolation insulating pattern is smaller than a second length of the second isolation insulating pattern in a vertical direction.

19 Claims, 22 Drawing Sheets

(51) Int. Cl.

| | |
|---|---|
| ***H10D 30/43*** | (2025.01) |
| ***H10D 62/10*** | (2025.01) |
| ***H10D 62/13*** | (2025.01) |
| ***H10D 64/01*** | (2025.01) |

(52) U.S. Cl.

CPC ....... *H10D 30/6735* (2025.01); *H10D 62/121* (2025.01); *H10D 62/151* (2025.01); *H10D 64/01* (2025.01)

(56) References Cited

U.S. PATENT DOCUMENTS

| | | | | |
|---|---|---|---|---|
| 10,475,890 | B2 | 11/2019 | Wang et al. | |
| 10,872,859 | B2 | 12/2020 | Kim et al. | |
| 11,133,217 | B1 | 9/2021 | Reznicek et al. | |
| 11,177,362 | B2 | 11/2021 | Lee et al. | |
| 2018/0358293 | A1 | 12/2018 | Hong et al. | |
| 2019/0006345 | A1* | 1/2019 | Wang | H10D 84/0151 |
| 2019/0148379 | A1 | 5/2019 | Yoon et al. | |
| 2020/0043945 | A1* | 2/2020 | Kim | H10D 84/038 |
| 2020/0105603 | A1 | 4/2020 | Chang et al. | |
| 2020/0119180 | A1 | 4/2020 | Frougier et al. | |
| 2021/0343709 | A1* | 11/2021 | Wang | H10B 99/00 |
| 2021/0391433 | A1 | 12/2021 | Kim et al. | |
| 2021/0408231 | A1 | 12/2021 | Huang et al. | |

OTHER PUBLICATIONS

Communication issued on Jun. 25, 2026 by the Intellectual Property Office of Singapore (IPOS) in Singapore Patent Application No. 10202260569S.

Office Action issued on Aug. 6, 2026 by the Taiwanese Patent Office in corresponding TW Patent Application No. 112102258.

* cited by examiner

SEMICONDUCTOR DEVICES

CROSS-REFERENCE TO RELATED APPLICATION(S)

This application is based on and claims priority under 35 U.S.C. 119 to Korean Patent Application No. 10-2022-0047647 filed on Apr. 18, 2022 in the Korean Intellectual Property Office, the disclosure of which is incorporated by reference herein in its entirety.

BACKGROUND

Example embodiments of the disclosure relate to a semiconductor device.

As the demand for high performance, high speed, and/or multifunctionality of a semiconductor device has increased, integration density of a semiconductor device has also increased. In manufacturing a semiconductor device having a fine pattern corresponding to the trend of high integration of the semiconductor device, it has been necessary to implement patterns having a fine width or a fine spacing. Also, to address the limitations of operation properties due to the size reduction of a planar metal oxide semiconductor FET (MOSFET), there have been attempts to develop a semiconductor device including a FinFET having a three-dimensional channel structure.

SUMMARY

An example embodiment of the disclosure includes a semiconductor device having improved electrical properties and improved productivity.

In accordance with an aspect of the disclosure, a semiconductor device includes a substrate; active regions extending in a first horizontal direction on the substrate, wherein the active regions include a first active region and a second active region spaced apart from each other in a second horizontal direction perpendicular to the first horizontal direction, and a third active region and a fourth active region spaced apart from each other in the second horizontal direction; gate structures including a first gate structure, a second gate structure, a third gate structure, and a fourth gate structure, wherein the first gate structure and the second gate structure intersect the first active region and the second active region and are spaced apart from each other in the first horizontal direction, and wherein the third gate structure and the fourth gate structure intersect the third active region and the fourth active region and are spaced apart from each other in the first horizontal direction; source/drain regions including a first source/drain region on the first active region between the first gate structure and the second gate structure, a second source/drain region on the second active region between the first gate structure and the second gate structure, a third source/drain region on the third active region between the third gate structure and the fourth gate structure, and a fourth source/drain region on the fourth active region between the third gate structure and the fourth gate structure; contact plugs including a first contact plug connected to the first source/drain region, a second contact plug connected to the second source/drain region, a third contact plug connected to the third source/drain region, and a fourth contact plug connected to the fourth source/drain region; a first isolation insulating pattern between the first contact plug and the second contact plug; and a second isolation insulating pattern between the third contact plug and the fourth contact plug, wherein a first length in a vertical direction of the first isolation insulating pattern is smaller than a second length in the vertical direction of the second isolation insulating pattern, wherein the vertical direction is perpendicular to an upper surface of the substrate.

In accordance with an aspect of the disclosure, a semiconductor device includes a substrate; active regions extending in a first horizontal direction on the substrate, wherein the active regions include a first active region and a second active region spaced apart from each other in a second horizontal direction perpendicular to the first horizontal direction, and a third active region and a fourth active region spaced apart from each other in the second horizontal direction; gate structures including a first gate structure, a second gate structure, a third gate structure, and a fourth gate structure, wherein the first gate structure and the second gate structure intersect the first active region and the second active region and are spaced apart from each other, and wherein the third gate structure and the fourth gate structure intersect the third active region and the fourth active region and are spaced apart from each other; source/drain regions including a first source/drain region on the first active region between the first gate structure and the second gate structure, a second source/drain region on the second active region between the first gate structure and the second gate structure, a third source/drain region on the third active region between the third gate structure and the fourth gate structure, and a fourth source/drain region on the fourth active region between the third gate structure and the fourth gate structure; contact plugs including a first contact plug connected to the first source/drain region, a second contact plug connected to the second source/drain region, a third contact plug connected to the third source/drain region, and a fourth contact plug connected to the fourth source/drain region; a first isolation insulating pattern between the first contact plug and the second contact plug; and a second isolation insulating pattern between the third contact plug and the fourth contact plug, wherein the first isolation insulating pattern is spaced apart from the first source/drain region and the second source/drain region, and wherein the second isolation insulating pattern contacts the third source/drain region and the fourth source/drain region.

In accordance with an aspect of the disclosure, a semiconductor device includes a substrate; active regions extending in a first horizontal direction on the substrate, wherein the active regions include a first active region, a second active region, a third active region, and a fourth active region spaced apart from each other; source/drain regions including a first source/drain region on the first active region, a second source/drain region on the second active region, a third source/drain region on the third active region, and a fourth source/drain region on the fourth active region; contact plugs including a first contact plug connected to the first source/drain region, a second contact plug connected to the second source/drain region, a third contact plug connected to the third source/drain region, and a fourth contact plug connected to the fourth source/drain region; a first isolation insulating pattern between the first contact plug and the second contact plug; and a second isolation insulating pattern between the third contact plug and the fourth contact plug, wherein the first isolation insulating pattern has a side surface profile different from a side surface profile of the second isolation insulating pattern.

BRIEF DESCRIPTION OF DRAWINGS

The above and other aspects, features, and advantages of certain embodiments of the disclosure will be more apparent from the following detailed description, taken in combination with the accompanying drawings, in which.

DETAILED DESCRIPTION

Hereinafter, embodiments of the disclosure will be described as follows with reference to the accompanying drawings.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present. Like numerals refer to like elements throughout.

Spatially relative terms, such as "over," "above," "on," "upper," "below," "under," "beneath," "lower," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

For the sake of brevity, conventional elements to semiconductor devices may or may not be described in detail herein for brevity purposes.

Figure 1:
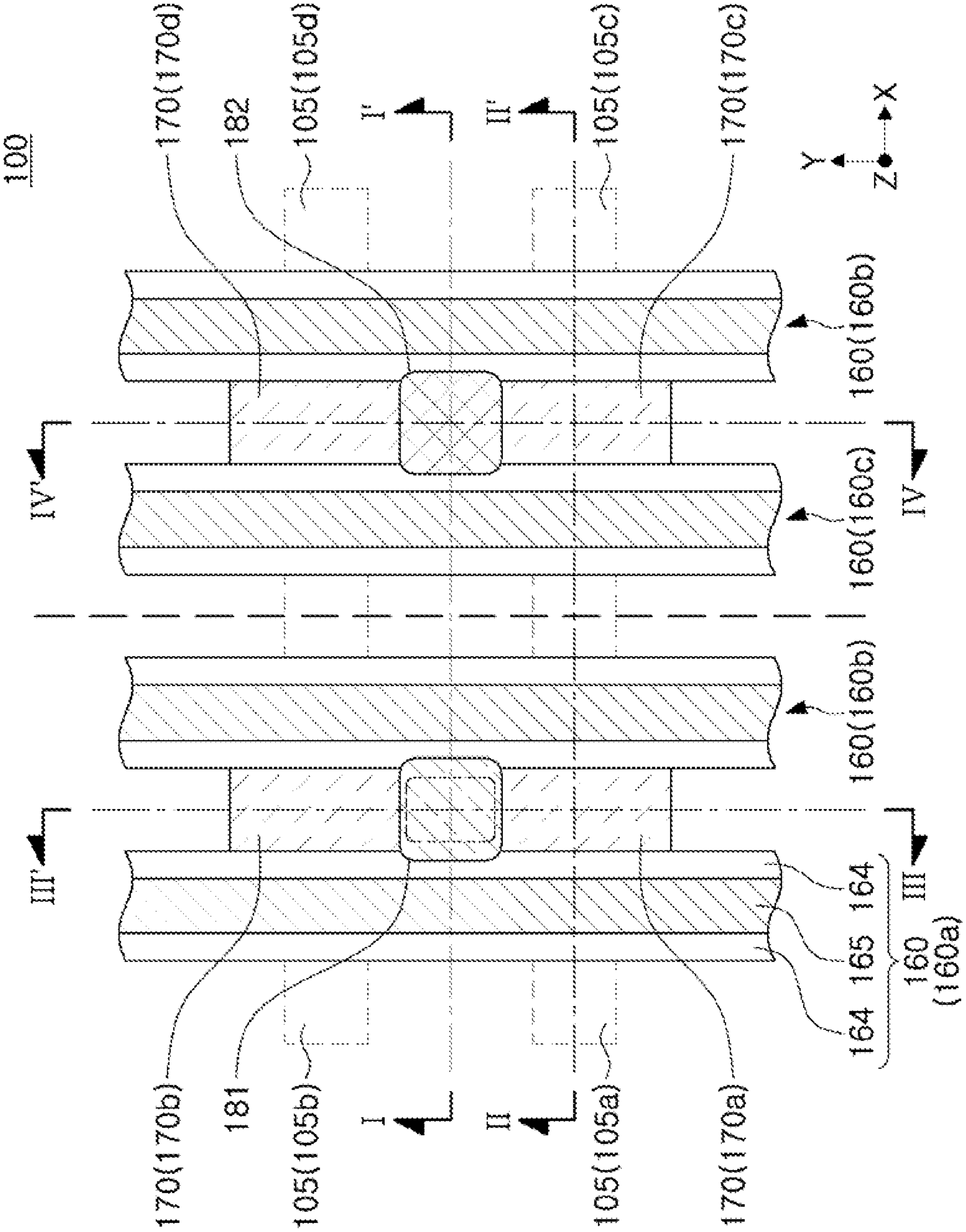
FIG. 1 is a plan diagram illustrating a semiconductor device according to an example embodiment.
Figure 2A:
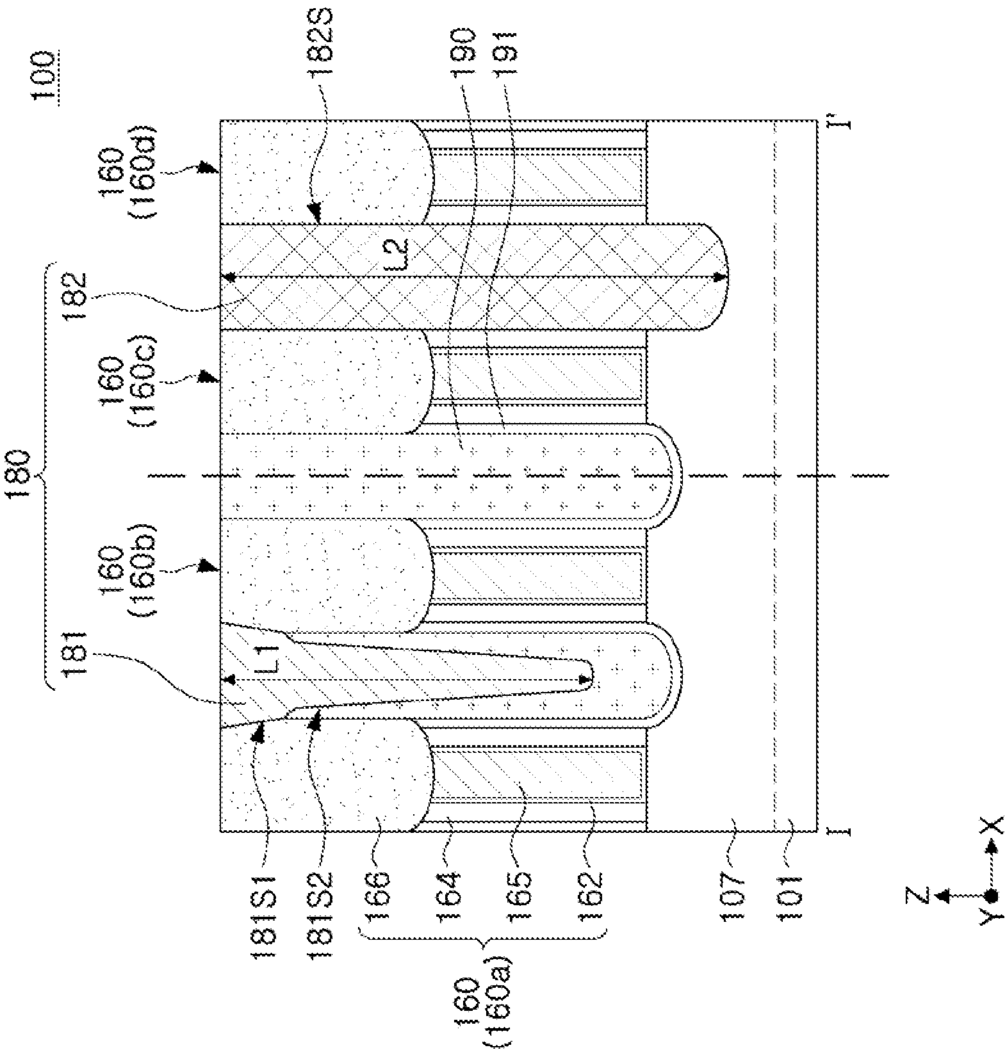
FIGS. 2A to 2C are cross-sectional diagrams illustrating a semiconductor device according to an example embodiment.
Figure 2B:
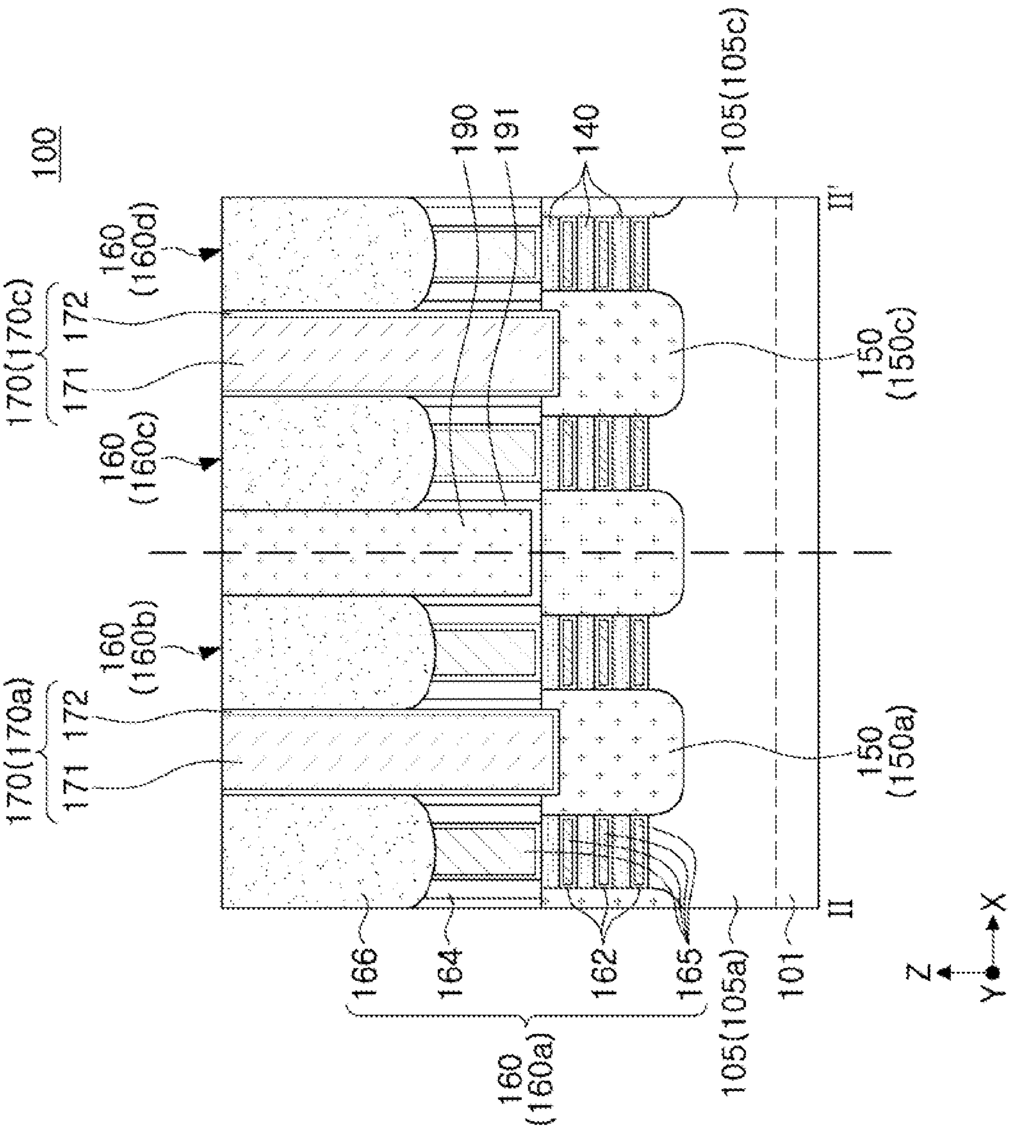
Figure 2C:
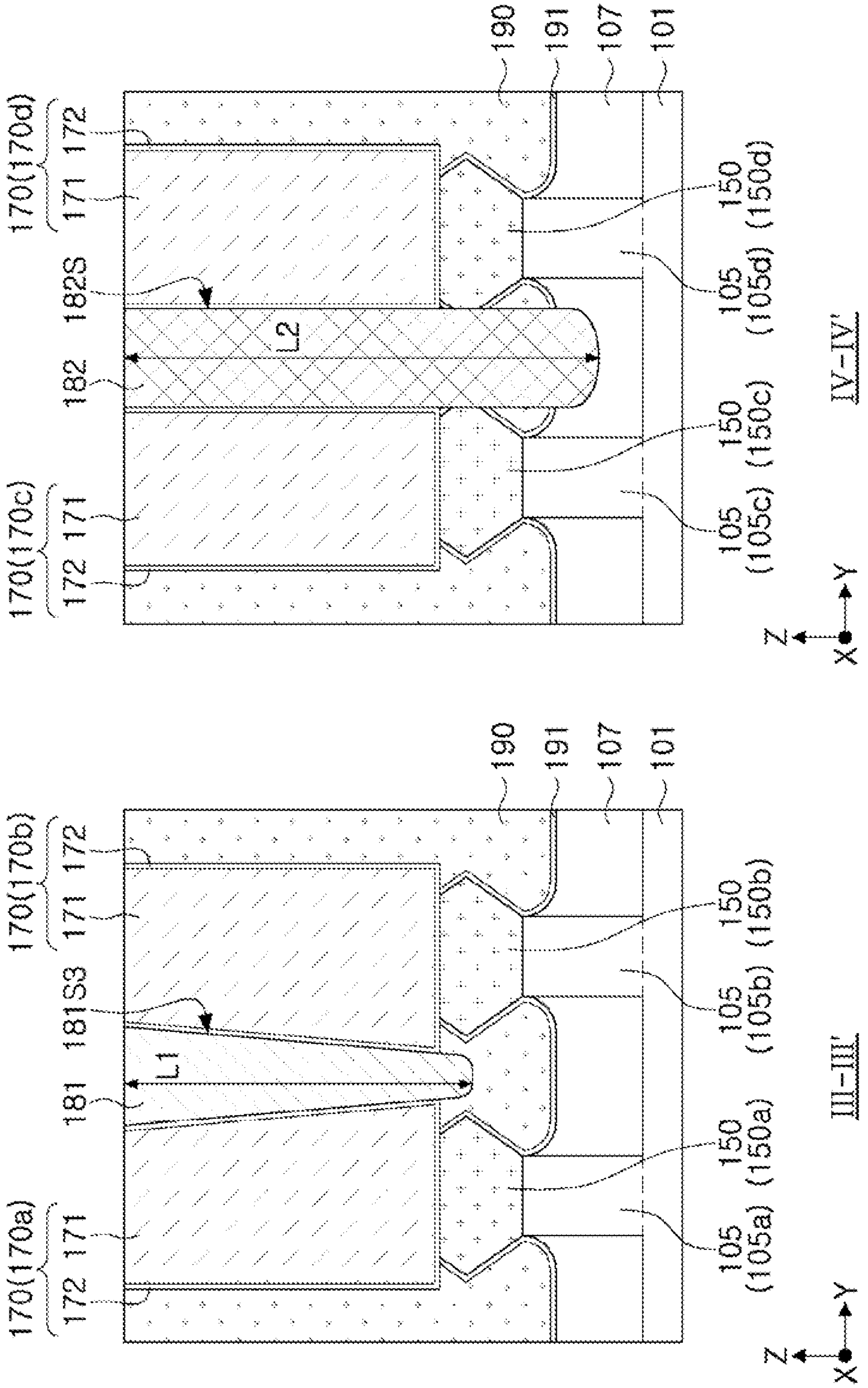

FIG. 1 is a plan diagram illustrating a semiconductor device 100 according to an example embodiment. FIGS. 2A and 2C are cross-sectional diagrams illustrating a semiconductor device 100 according to an example embodiment. FIG. 2A is a cross-sectional diagram illustrating a semiconductor device 100 taken along line I-I' in FIG. 1, FIG. 2B is a cross-sectional diagram illustrating a semiconductor device 100 taken along line II-II' in FIG. 1, and FIG. 2C is a cross-sectional diagram illustrating a semiconductor device 100 taken along line III-III' in FIG. 1. Only main components of the semiconductor device are illustrated in FIGS. 1 to 2C for ease of description.

Referring to FIGS. 1 to 2C, the semiconductor device 100 may include a substrate 101, active regions 105 on the substrate 101, device isolation layers 107 isolating the active regions 105 from each other, a plurality of channel layers 140 disposed on the active regions 105, source/drain regions 150 in contact with the channel layers 140, gate structures 160 extending by intersecting the active regions 105, contact plugs 170, isolation insulating patterns 180, and an interlayer insulating layer 190.

In an example embodiment, in the semiconductor device 100, the active regions 105 may have a fin structure, and the gate electrode 165 may be disposed between the active regions 105 and the channel layers 140, between the channel layers 140, and in an upper portion of the channel layers 140. Accordingly, the semiconductor device 100 may be configured as a transistor having a multi-bridge channel FET (MBCFET™) structure, which may be a gate-all-around (GAA) field effect transistor formed by the channel layers 140, the source/drain regions 150, and the gate structures 160.

However, differently from the aforementioned example embodiments, the semiconductor device 100 may be implemented as a fin-type field effect transistor (FinFET) in which the active regions 105 may have a fin structure, the channel layers 140 may not be included, and a physical channel region of the transistor may be formed in an upper region of each of the active regions 105 intersecting the gate electrode 165. In this case, the gate electrode 165 may extend to cover the upper and side surfaces of each of the active regions 105.

The substrate 101 may have an upper surface extending in the x-direction and they direction. The substrate 101 may include a semiconductor material, such as, for example, a group IV semiconductor, a group III-V compound semiconductor, or a group II-VI compound semiconductor. For example, the group IV semiconductor may include silicon, germanium, or silicon-germanium. The substrate 101 may be provided as a bulk wafer, an epitaxial layer, a silicon on insulator (SOI) layer, a semiconductor on insulator (SeOI) layer, or the like.

The active regions 105 may be disposed to extend in a direction parallel to the upper surface of the substrate 101, that is, for example, in the x direction. The active regions 105 may be spaced apart from each other in the y direction and disposed in parallel to each other (see, e.g., FIGS. 2B and 2C). The active regions 105 may protrude from the upper surface of the substrate 101 in the z-direction, a perpendicular direction. The upper ends of the active regions 105 may be disposed to protrude to a predetermined level from the upper surface of device isolation layers 107. The active regions 105 may be formed as a portion of the substrate 101, or may include an epitaxial layer grown from the substrate 101. However, the active regions 105 on the substrate 101 may be partially recessed on both sides of the gate structures 160, and the source/drain regions 150 may be disposed on the recessed active regions 105.

In an example embodiment, the active regions 105 may include first to fourth active regions **105*a* and 105*b*, 105*c*, and 105*d*. Each of the first active region 105*a* and the second active region 105*b* may have a line shape or a bar shape extending in the first horizontal direction (e.g., the x direction). The first active region 105*a* and the second active region 105***b* may be spaced apart from each other in a second horizontal direction (e.g., the y direction) and may extend in parallel to each other. Each of the third active region 105*c* and the fourth active region 105*d* may have a line shape or a bar shape extending in the first horizontal direction (e.g., the x direction). The third active region 105*c* and the fourth active region 105*d* may be spaced apart from each other in the second horizontal direction (e.g., the y direction) and may extend in parallel to each other.

The device isolation layers 107 may define active regions 105 in the substrate 101. The device isolation layers 107 may be disposed between adjacent ones of the active regions 105. The device isolation layers 107 may have upper portions on a level lower than a level of the upper portions of the active regions 105. Accordingly, the device isolation layers 107 may partially expose the upper portions of the active regions 105. In an example embodiment, the device isolation layers 107 may have a curved upper surface having a level increasing toward the active regions 105, but an example embodiment thereof is not limited thereto. The device isolation layers 107 may be formed by, for example, a shallow trench isolation (STI) process. The device isolation layers 107 may be formed of an insulating material. The device isolation layers 107 may be, for example, oxide, nitride, or a combination thereof.

As illustrated in FIG. 2B, the channel layers 140 may be stacked and spaced apart from each other in the z direction perpendicular to the upper surface of the substrate 101 on the active regions 105. The channel layers 140 may be connected to the source/drain regions 150 and may be spaced apart from the upper surfaces of the active regions 105. The channel layers 140 may have the same width as or a similar width to that of the active regions 105 in they direction, and may have the same width as or a similar width to that of the gate structures 160 in the x-direction. Three channel layers 140 are illustrated in the diagram (e.g., FIG. 2B), but the number of channel layers is not limited thereto and may be varied. For example, in example embodiments, the channel layers 140 may further include a channel layer disposed on the upper surface of the active regions 105. The channel layers 140 may be formed of a semiconductor material, and may include, for example, at least one of silicon (Si), silicon germanium (SiGe), and germanium (Ge). The channel layers 140 may include the same material, or may include different materials in example embodiments.

The source/drain regions 150 may be disposed on the active regions 105 on at least one side of the channel layers 140. The source/drain regions 150 may be disposed to cover upper surfaces of the active regions 105 on a side surface of each of the channel layers 140 and on a lower end of the source/drain regions 150. In other words, the source/drain regions 150 may be disposed to cover upper surfaces of the active regions 105 and side surfaces of the channel layers 140. The source/drain regions 150 may be in contact with the channel layers 140. The source/drain regions 150 may be partially recessed into the upper portions of the active regions 105, but in example embodiments, the presence of the recess and the depth of the recess may be varied. The source/drain regions 150 may be a semiconductor layer including silicon (Si), and may include an epitaxial layer.

Each of the source/drain regions 150 may include impurities of different types and/or concentrations.

In an example embodiment, the source/drain regions 150 may include a first source/drain region 150*a* disposed on the first active region 105*a*, a second source/drain region 150*b* disposed on the second active region 105*b*, a third source/drain region 150*c* disposed on the third active region 105*c*, and a fourth source/drain region 150*d* disposed on the fourth active region 105*d*.

The gate structures 160 may intersect the active regions 105 and the channel layers 140 when viewed in a plan view, and may extend in one direction, that is, for example, they direction. The gate structures 160 may be spaced apart from each other. Channel regions of transistors may be formed in the active regions 105 and/or the channel layers 140 intersecting the gate structures 160.

Each of the gate structures 160 may include a gate dielectric layer 162, a gate electrode 165, a spacer structure 164, and a capping layer 166. The gate structures 160 may be in contact with the channel layers 140 between the channel layers 140.

The gate dielectric layer 162 may be disposed between each of the active regions 105 and the gate electrode 165 and between the channel layers 140 and the gate electrode 165, and may cover at least a portion of the surfaces of the gate electrode 165. For example, the gate dielectric layer 162 may be disposed to surround the entirety of surfaces of the gate electrode 165 other than the uppermost upper surface of the gate electrode 165. The gate dielectric layer 162 may extend to a region between the gate electrode 165 and the spacer structure 164, but an example embodiment thereof is not limited thereto. The gate dielectric layer 162 may include an oxide, nitride, or high-k material. The high-k material may refer to a dielectric material having a dielectric constant higher than that of a silicon oxide layer ($SiO_2$). The high-k material may refer to a dielectric material having a dielectric constant higher than that of a silicon oxide layer ($SiO_2$). The high dielectric constant material may be one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$). In example embodiments, the gate dielectric layer 162 may include multiple layers.

The gate electrode 165 may fill a gap between the channel layers 140 on the active regions 105 and may extend to an upper portion of the channel layers 140. The gate electrode 165 may be spaced apart from the channel layers 140 by the gate dielectric layer 162. The gate electrode 165 may include a conductive material, such as, for example, a metal nitride such as titanium nitride (TiN), tantalum nitride (TaN), or tungsten nitride (WN), and/or a metal material such as aluminum (Al), tungsten (W), or molybdenum (Mo), or a semiconductor material such as doped polysilicon. In example embodiments, the gate electrode 165 may include multiple layers, two or more layers. Depending on the configuration of the semiconductor device 100, the gate electrode 165 may be isolated by a separator between at least a portion of the transistors adjacent to each other. The gate electrode 165 may include different materials depending on transistor regions.

The spacer structure 164 may be disposed on both sidewalls of the gate electrode 165 and may extend in the z-direction perpendicular to the upper surface of the substrate 101. The spacer structures 164 may include a portion in which a width of the upper portion is smaller than a width of the lower portion. The spacer structure 164 may include a curved upper surface, curved toward the substrate 101. However, the shape of the spacer structure 164 may be varied in example embodiments. The spacer structure 164 may insulate the source/drain regions 150 from the gate electrode 165. The spacer structure 164 may include multiple layers in example embodiments. The spacer structure 164 may be formed of oxide, nitride, and oxynitride.

The capping layer 166 may be disposed on the gate electrode 165. The capping layer 166 may be a structure for protecting the gate electrode 165 from etching in a subsequent process after forming the gate electrode 165. The capping layer 166 may be a structure supporting the contact plugs 170 to be self-aligned during the process of forming a contact plug. However, the example embodiment of the capping layer 166 is not limited thereto.

The capping layer 166 may be disposed on the gate electrode 165 and the spacer structure 164, and at least a portion of the lower surface thereof may be surrounded by the gate electrode 165 and the spacer structure 164. In an example embodiment, the capping layer 166 may include a lower surface having a curved shape, convexly curved toward the substrate 101. The capping layer 166 may include silicon nitride or a silicon nitride-based insulating material.

In an example embodiment, the gate structures 160 may include first and second gate structures 160*a* and 160*b* intersecting the first and second active regions 105*a* and 105*b*, spaced apart from each other, and extending in parallel to each other. The gate structures 160 may further include third and fourth gate structures 160*c* and 160*d* intersecting the third and fourth active regions 105*c* and 105*d*, spaced apart from each other, and extending in parallel to each other.

In an example embodiment, referring to FIG. 2C, the first source/drain region 150*a* may be disposed on the first active region 105*a* between the first and second gate structures 160*a* and 160*b*, and the second source drain region 150*b* may be disposed on the second active region 105*b* between the first and second gate structures 160*a* and 160*b*. Also, the third source/drain region 150*c* may be disposed on the third active region 105*c* between the third and fourth gate structures 160*c* and 160*d*, and the fourth source/drain region 150*d* may be disposed on the fourth active region 105*d* between the third and fourth gate structures 160*c* and 160*d*.

In an example embodiment, the semiconductor device 100 may further include internal spacer layers disposed in parallel to the gate electrode 165 between the channel layers 140. The internal spacer layers may be disposed on the same level as a level of the channel layers 140. The gate electrode 165 disposed below the uppermost portion of the channel layers 140 may be spaced apart from the source/drain regions 150 by the internal spacer layers and may be electrically isolated from the source/drain regions 150. The internal spacer layers may have a shape in which side surfaces opposing the gate electrode 165 have a rounded shape, rounded inwardly toward the gate electrode 165, but an example embodiment thereof is not limited thereto. The internal spacer layers may be formed of oxide, nitride, or oxynitride, and may be formed as a low-k film in particular. According to an example embodiment, as illustrated in FIG. 2B, the internal spacer layers may not be provided.

The contact plugs 170 may penetrate through interlayer insulating layer 190 and may be connected to the source/drain regions 150. The contact plugs 170 may apply electrical signals to the source/drain regions 150.

Each of the contact plugs 170 may have an inclined side surface of which a width decreases in a direction toward the substrate 101 depending on an aspect ratio, but an example embodiment thereof is not limited thereto. Each of the contact plugs 170 may be recessed from the source/drain regions 150 by a predetermined depth. However, in example embodiments, the contact plugs 170 may be in contact with the upper surfaces of the source/drain regions 150 without being recessed into the source/drain regions 150.

The contact plugs 170 may extend toward the source/drain regions 150 between the adjacent gate structures 160 and may be in contact with the source/drain regions 150.

In an example embodiment, the contact plugs 170 may be configured as self-aligning contacts (SAC) aligned by the gate structures 160. In this case, the contact plugs 170 may be aligned by the capping layer 166 of the adjacent gate structures 160. Alternatively, the contact plugs 170 may be formed using a separate mask.

The contact plugs 170 may include a plug layer 171 and a barrier layer 172. The plug layer 171 may include metal nitride such as titanium nitride (TiN), tantalum nitride (TaN), or tungsten nitride (WN), and/or a metal material such as aluminum (Al), tungsten (W), or molybdenum (Mo), for example. The barrier layer 172 may conformally cover side surfaces and a bottom surface of the plug layer 171. The barrier layer 172 may include, for example, a metal nitride such as a titanium nitride layer (TiN), a tantalum nitride layer (TaN), or a tungsten nitride layer (WN). The barrier layer 172 may allow the plug layer 171 and the isolation insulating patterns 180 to be apart from each other. The barrier layer 172 may extend along one side surface of the isolation insulating patterns 180 between the plug layer 171 and the isolation insulating patterns 180.

In an example embodiment, the contact plugs 170 may include a first contact plug 170*a* connected to the first source/drain region 150*a*, a second contact plug 170*b* connected to the second source/drain region 150*b*, a third contact plug 170*c* connected to the third source/drain region 150*c*, and a fourth contact plug 170*d* connected to the fourth source/drain region 150*d*. The first to fourth contact plugs 170*a*, 170*b*, 170*c*, and 170*d* may be spaced apart from each other.

Figure 6:
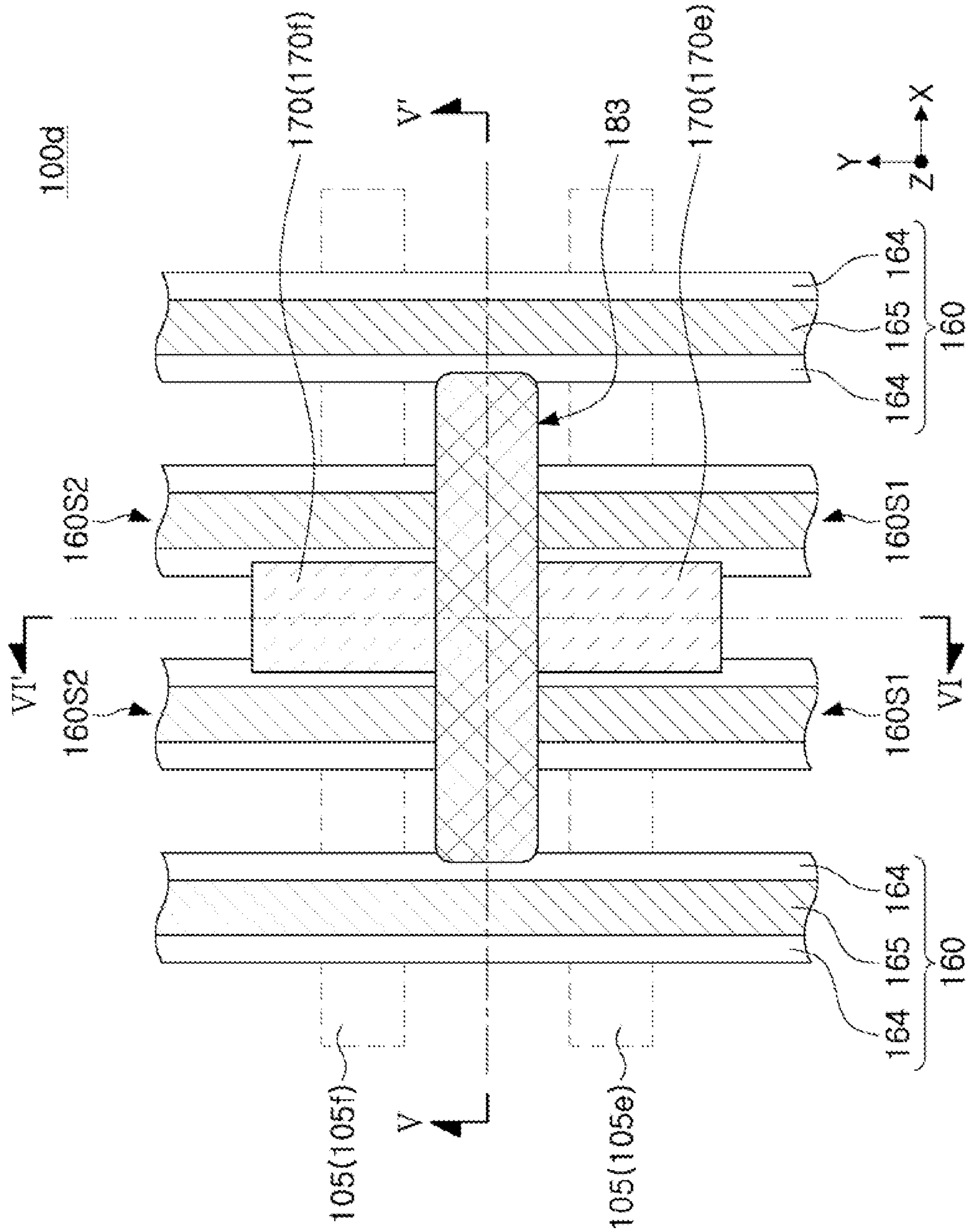
FIG. 6 is a cross-sectional diagram illustrating a semiconductor device according to an example embodiment.
Figure 7A:
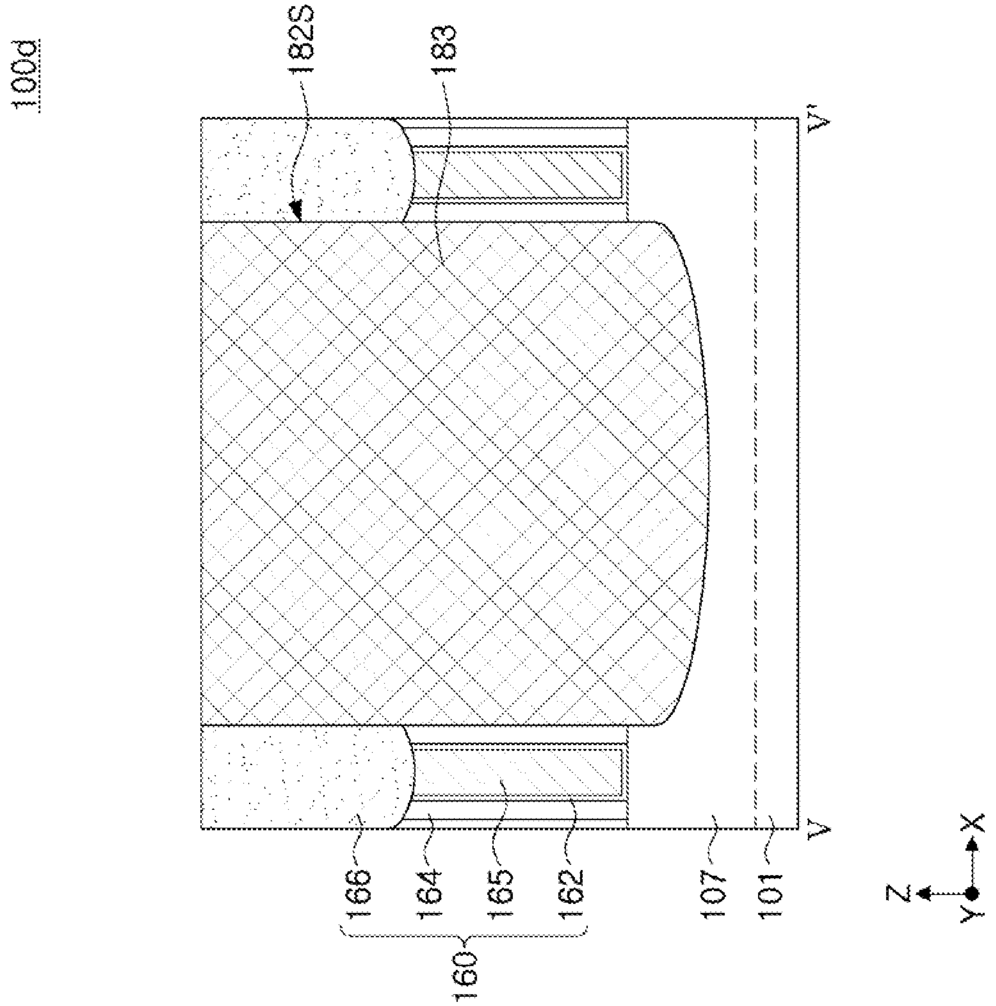
FIGS. 7A and 7B are cross-sectional diagrams illustrating a semiconductor device according to an example embodiment.
Figure 7B:
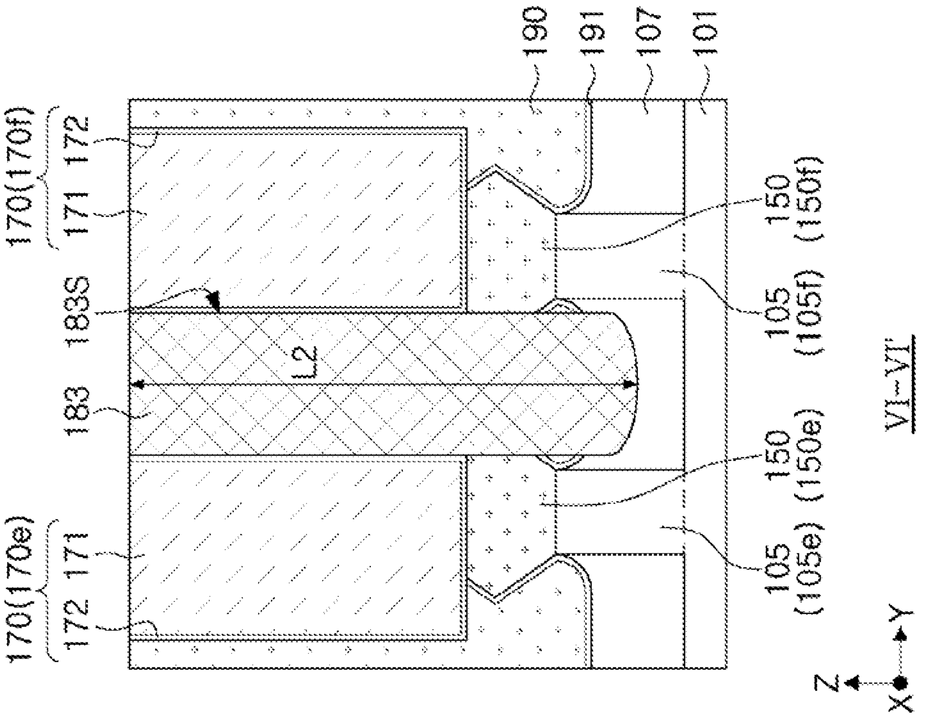
Figure 8:
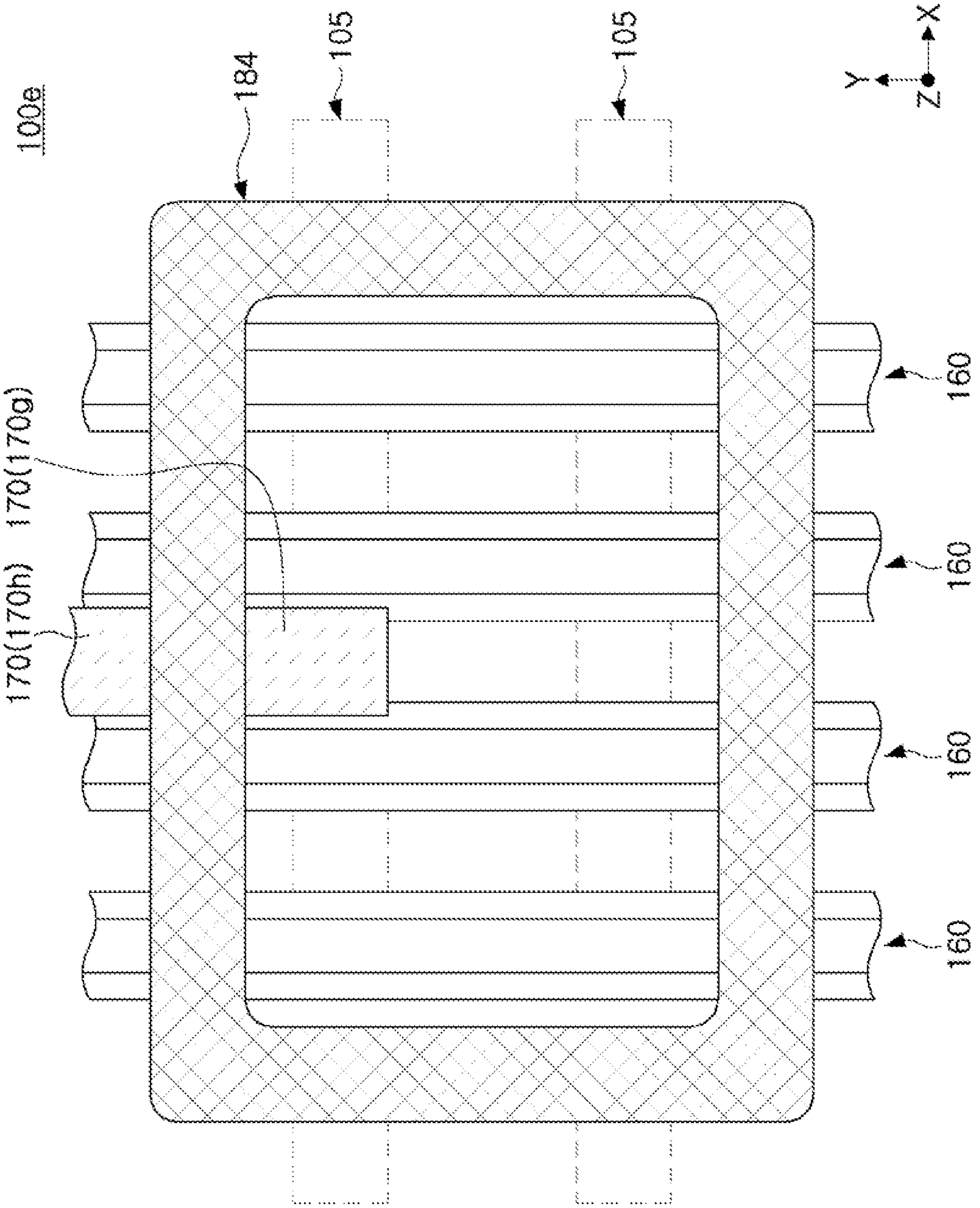
FIG. 8 is a plan diagram illustrating a semiconductor device according to an example embodiment.

Each of the isolation insulating patterns 180 may isolate contact plugs 170 adjacent to each other in one direction (e.g., they direction as shown in FIG. 1). The isolation insulating patterns 180 may be disposed in a hole shape between gate structures 160 adjacent to each other. The hole shape may have various shapes such as a square, a rectangle, a circle, and a polygon having rounded corners on a plane. Also, as illustrated in FIGS. 6 to 8, a portion of the isolation insulating patterns 180 may have various shapes, such as a line shape or a dam shape surrounding a specific closed space.

The isolation insulating patterns 180 may include an insulating material such as oxide, nitride, or carbide, and may include, for example, silicon nitride. In an example embodiment, each of the isolation insulating patterns 180 may be a single insulating material layer, but an example embodiment thereof is not limited thereto, and the isolation insulating patterns 180 may have a multilayer structure.

In an example embodiment, the isolation insulating patterns 180 may include a first isolation insulating pattern 181 isolating the first contact plug 170*a* from the second contact plug 170*b*, and a second isolation insulating pattern 182 isolating the third contact plug 170*c* from the fourth contact plug 170*d*. The first isolation insulating pattern 181 may be in contact with each of the first and second contact plugs 170*a* and 170*b* between the first and second contact plugs 170*a* and 170*b*, and the second isolation insulating pattern 182 may be in contact with the third and fourth contact plugs 170*c* and 170*d* between the third and fourth contact plugs 170*c* and 170*d*, respectively.

In an example embodiment, side surfaces of the first and second isolation insulating patterns 181 and 182 may be in contact with the gate structures 160 in a first horizontal direction (e.g., the x direction), and may be in contact with the contact plugs 170 in the second horizontal direction (e.g., a y direction).

A side surface of the first isolation insulating pattern 181 and a side surface of the second isolation insulating pattern 182 may have different shapes.

In an example embodiment, the first isolation insulating pattern 181 may have an inclined side surface of which a width may decrease in a direction toward the substrate 101. The side surface of the first isolation insulating pattern 181 may have a plurality of side surfaces including a first side surface 181S1 having a first slope in the first horizontal direction and a second side surface 181S2 having a second slope in the first horizontal direction greater than the first slope. For example, the first side surface 181S1 and the second side surface 181S2 may have different slopes. A side surface of the first isolation insulating pattern 181 may have a third side surface 181S3 having a third slope in the second horizontal direction, as illustrated in FIG. 2C. However, the shape of the side surface of the first isolation insulating pattern 181 is not limited thereto and may be varied.

In an example embodiment, referring to FIG. 2C, the first and second contact plugs 170*a* and 170*b* may have a width increasing toward the substrate 101 in the second horizontal direction (e.g., the y direction). This is because, when the first and second contact plugs 170*a* and 170*b* are formed by a wet etching process, openings corresponding to the second contact plugs 170*a* and 170*b* may be formed along a third side surface 181S3 of the first isolation insulating pattern 181 having the third slope. However, when the first and second contact plugs 170*a* and 170*b* are formed by a dry etching process, the width may decrease toward the substrate 101.

In an example embodiment, a side surface of the second isolation insulating pattern 182 may have a side surface 182S having a fourth slope as illustrated in FIGS. 2A and 2C. A side surface of the second isolation insulating pattern 182 may have substantially the same slope in the first horizontal direction and the second horizontal direction. The second isolation insulating pattern 182 may have the side surface 182S having the constant fourth slope. The fourth slope may be, for example, about 80 degrees to about 100 degrees, such as, for example, about 90 degrees. However, the shape of the side surface of the second isolation insulating pattern 182 is not limited thereto and may be varied.

In an example embodiment, the third and fourth contact plugs 170*a* and 170*b* may have a width decreasing toward the substrate 101 or may have a constant width, in the second horizontal direction (e.g., the y direction).

The first and second isolation insulating patterns 181 and 182 may have different side surface profiles as the first and second isolation insulating patterns 181 and 182 may be formed by different etching processes. For example, the first isolation insulating pattern 181 may be a structure formed by selectively etching the interlayer insulating layer 190 with respect to the adjacent gate structures 160 under a specific etching condition, and the second isolation insulating pattern 182 may be a structure formed by etching without an etching selectivity.

The first isolation insulating pattern 181 may extend by penetrating through a portion of the interlayer insulating layer 190 disposed between the first and second gate structures 160*a* and 160*b*. The first isolation insulating pattern 181 may be disposed on the device isolation layers 107 between the first and second active regions 105*a* and 105*b*. The second isolation insulating pattern 182 may extend by penetrating through a portion of the interlayer insulating layer 190 disposed between the third and fourth gate structures 160*c* and 160*d*. The second isolation insulating pattern 182 may be disposed on the device isolation layers 107 between the third and fourth active regions 105*c* and 105*d*.

Referring to FIGS. 2A and 2C, a first length L1 of the first isolation insulating pattern 181 in the z direction may be smaller than a second length L2 of the second isolation insulating pattern 182 in the z direction. Upper surfaces of the first and second isolation insulating patterns 181 and 182 may be disposed on substantially the same level. That is, the first isolation insulating pattern 181 may extend by penetrating through the interlayer insulating layer 190 by a depth relatively smaller than that of the second isolation insulating pattern 182. Accordingly, the lower surface of the first isolation insulating pattern 181 may be disposed on a level higher than a level of the lower surface of the second isolation insulating pattern 182. In an example embodiment, the lower surface of the first isolation insulating pattern 181 may be disposed on a level higher than a level of the lower surface of each of the source/drain regions 150, and the lower surface of the second isolation insulating pattern 182 may be disposed on a level lower than a level of the lower surface of each of the source/drain regions 150. The lower surface of the first isolation insulating pattern 181 may be disposed in the interlayer insulating layer 190, and the lower surface of the second isolation insulating pattern 182 may be disposed in the device isolation layer 107.

The average width and/or average planar area of the first isolation insulating pattern 181 may be smaller than the average width and/or average planar area of the second isolation insulating pattern 182. In example embodiments, "average width" may refer to an average value of widths at each level of a corresponding component, and "average planar area" may refer to an average value of planar areas at each level of a corresponding component.

The first isolation insulating pattern 181 may be spaced apart from the source/drain regions 150 and/or the device isolation layers 107. The second isolation insulating pattern 182 may be disposed to be in contact with the source/drain regions 150 and/or the device isolation layers 107. This is because the second isolation insulating pattern 182 may be configured as an insulating pattern extending by a depth greater than that of the first isolation insulating pattern 181 and penetrating through at least a portion of the source/drain regions 150 and/or the device isolation layers 107.

In an example embodiment, the first isolation insulating pattern 181 may be spaced apart from the spacer structure 164, and the second isolation insulating pattern 182 may be in contact with the spacer structure 164. This is because the second isolation insulating pattern 182 may be configured as an insulating pattern having a width greater than a width of the first isolation insulating pattern 181 and formed in an opening penetrating through at least a portion of the spacer structure 164 together with the interlayer insulating layer 190.

In an example embodiment, the first and second isolation insulating patterns 181 and 182 may include the same insulating material. However, in example embodiments, the first and second isolation insulating patterns 181 and 182 may include different materials. This may be because the first and second isolation insulating patterns 181 and 182 may be formed through different processes.

As the first isolation insulating patterns 181 are formed by an etching process having an etch selectivity, the contact plugs 170 may be isolated without affecting electrical properties of the transistors including the gate structures 160 and the source/drain regions 150. As the second isolation insulating patterns 182 are formed by an etching process having no etch selectivity, the second isolation insulating patterns 182 may extend by a relatively deep depth, thereby preventing leakage current caused by contact between the contact plugs 170 adjacent to each other. In the semiconductor device 100 according to the example embodiments, since the first and second isolation insulating patterns 181 and 182, two types of isolation insulating patterns, are selectively disposed for each region, the semiconductor device 100 having improved electrical properties and productivity may be provided.

The interlayer insulating layer 190 may cover the source/drain regions 150 and the gate structures 160, and may cover the device isolation layers 107. The interlayer insulating layer 190 may include, for example, at least one of oxide, nitride, and oxynitride, and may include a low-k material.

In an example embodiment, the semiconductor device 100 may further include an insulating liner 191 covering a lower surface of the interlayer insulating layer 190. The insulating liner 191 may include a material different from that of the interlayer insulating layer, such as, for example, silicon nitride or a silicon nitride-based insulating material. The insulating liner 191 may be disposed between the device isolation layers 107 and the interlayer insulating layer 190 and may extend to surfaces of the source/drain regions 150 not in contact with the contact plugs 170. Also, the insulating liner 191 may extend to side surfaces of the gate structures 160.

In an example embodiment, a lower surface of the capping layer 166 may cover the gate electrode 165, the spacer structure 164, and the insulating liner 191 extending to side surfaces of the spacer structure 164.

Figure 3:
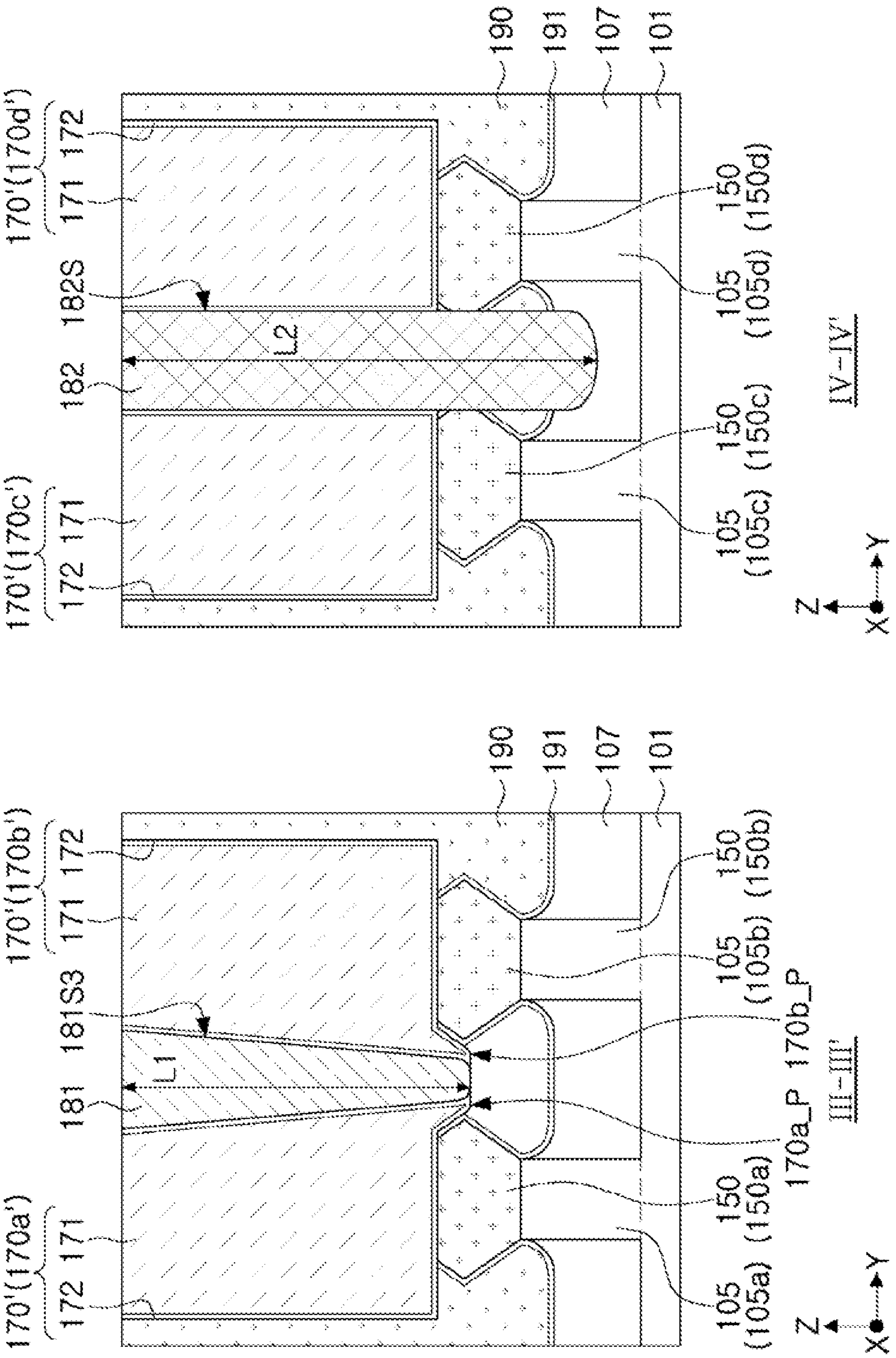
FIG. 3 is a cross-sectional diagram illustrating a semiconductor device according to an example embodiment.

FIG. 3 is a cross-sectional diagram illustrating a semiconductor device **100*a* according to an example embodiment, taken along lines III-III' and IV-IV' in FIG. 1**.

Referring to FIG. 3, the semiconductor device **100*a* may have a structure of contact plugs 170' different from the examples in FIGS. 1 to 2**C.

The contact plugs 170' may have a relatively large width in the second horizontal direction (e.g., the y direction). In an example embodiment, the first and second contact plugs **170*a*' and 170*b*' may be in contact with the third side surface 181S3 of the first isolation insulating pattern 181 in the second horizontal direction. The first isolation insulating pattern 181 may be spaced apart from the first and second source/drain regions 150*a* and 150*b*. Each of the first and second contact plugs 170*a*' and 170*b*' may include extension portions 170*a*_P and 170*b*_P extending to a space between the first and second source/drain regions 150*a* and 150*b* and first isolation insulating pattern 181. The extension portions 170*a*_P and 170*b*_P may cover a lower end of the third side surface 181S3 or a portion of a lower surface of the first isolation insulating pattern 181. However, the extension portions 170*a*_P and 170*b*_P of the first and second contact plugs 170*a*' and 170*b*'** may be spaced apart from each other.

In an example embodiment, the third and fourth contact plugs **170*c*' and 170*d*' may be in contact with the second isolation insulating pattern 182** in the second horizontal direction.

The second isolation insulating pattern 182 may be in contact with the third and fourth source/drain regions **150*c* and 150*d*. Differently from the first and second contact plugs 170*a*' and 170*b*', the third and fourth contact plugs 170*c*' and 170*d*' may not include extension portions. This is because there may be no space between the source/drain regions 150 and the second isolation insulating patterns 182 as the second isolation insulating patterns 182 in contact with the source/drain regions 150 have a relatively great width and great depth as compared to the first isolation insulating pattern 181**.

The contact plugs 170' according to the example embodiments may have a structure formed through, for example, a wet etching process. When an opening having a relatively larger width (defined in the second horizontal direction) as compared to the example in FIG. 2C is formed through the wet etching process, the openings adjacent to the first isolation insulating pattern 181 may include a portion extending to a space between the first isolation insulating pattern 181 and the source/drain regions 150, but the openings adjacent to the second isolation insulating pattern 182 may not include a portion extending into the space between the second isolation insulating pattern 182 and the source/drain regions 150.

Figure 4:
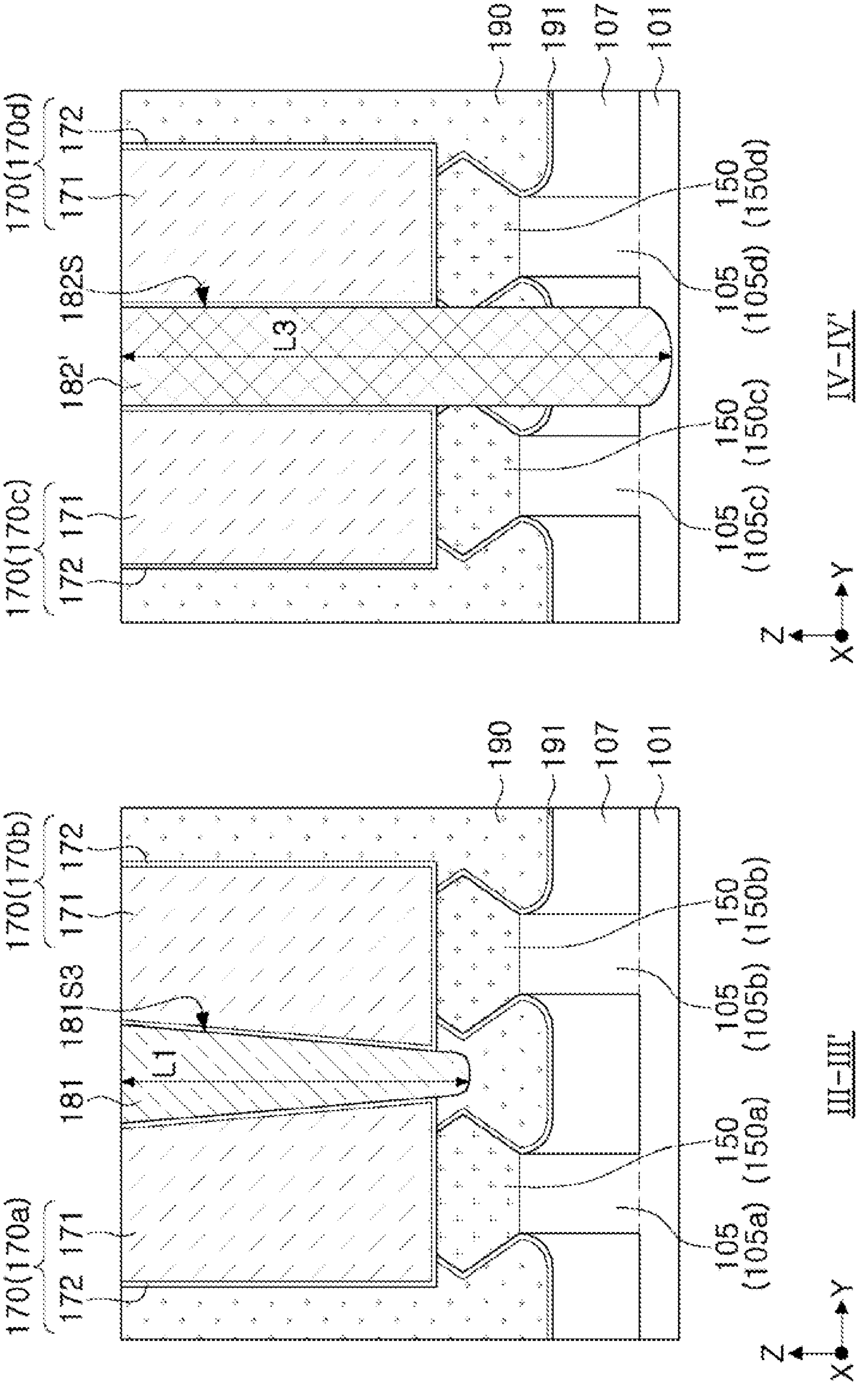
FIG. 4 is a cross-sectional diagram illustrating a semiconductor device according to an example embodiment.

FIG. 4 is a cross-sectional diagram illustrating a semiconductor device **100*b* according to an example embodiment, taken along lines and IV-IV' in FIG. 1**.

Referring to FIG. 4, the semiconductor device **100*b* may have a second isolation insulating pattern 182' structure different from the example described with reference to FIGS. 1 to 2**C.

The third length L3 of the second isolation insulating pattern 182' in the z direction may be greater than the first length L1 of the first isolation insulating pattern 181 in the z direction. The third length L3 may be greater than the second length L2 of the second isolation insulating pattern 182 in FIG. 2C. The second isolation insulating pattern 182' may penetrate through the device isolation layers 107 together with the interlayer insulating layer 190. In an example embodiment, the second isolation insulating pattern 182' may extend into the substrate 101 by penetrating through the device isolation layers 107 and may be in contact with the substrate 101. However, in example embodiments, the second isolation insulating pattern 182' may be in contact with the upper surface of the substrate 101 without forming a recess portion of the substrate 101.

Figure 5:
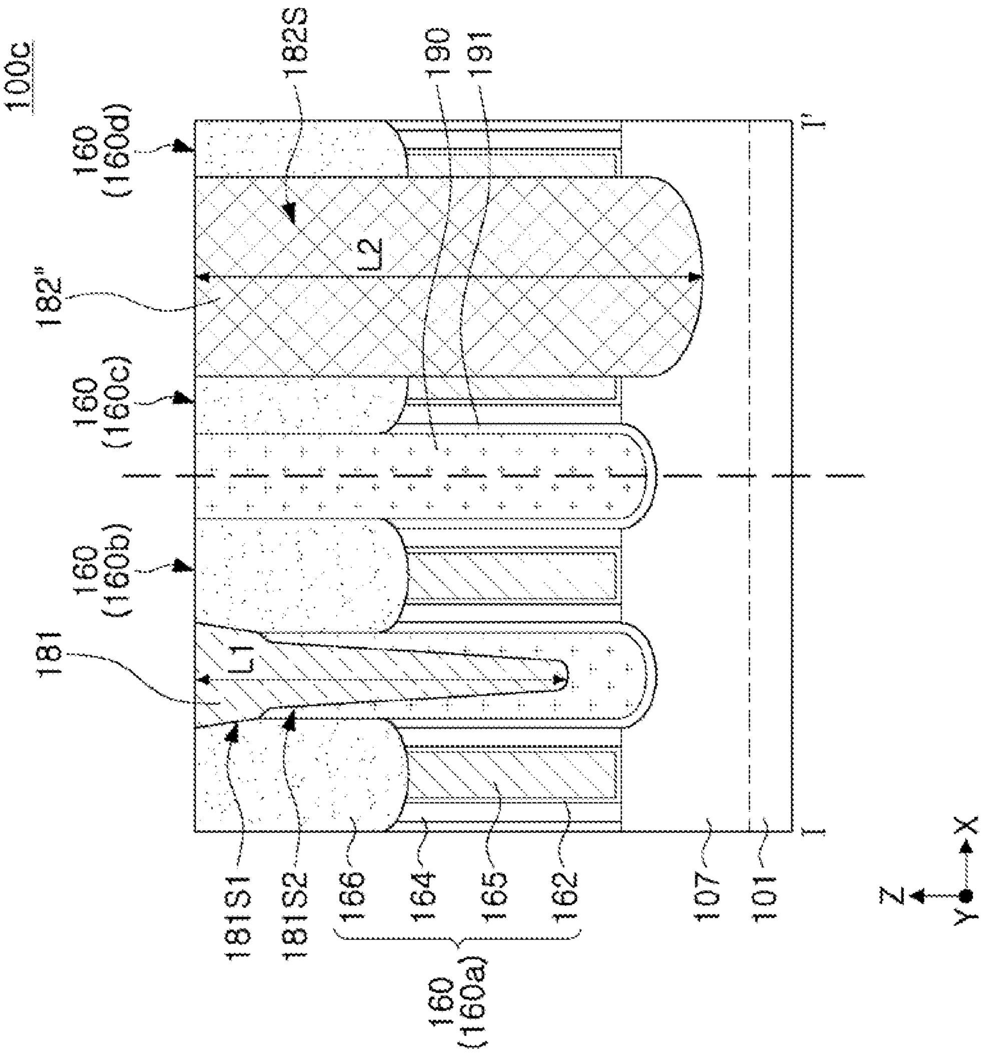
FIG. 5 is a cross-sectional diagram illustrating a semiconductor device according to an example embodiment.

FIG. 5 is a cross-sectional diagram illustrating a semiconductor device **100*c* according to an example embodiment, taken along line I-I' in FIG. 1**.

Referring to FIG. 5, the semiconductor device **100*c* may have a second isolation insulating pattern 182" structure different from the example described with reference to FIGS. 1 to 2**C.

The second isolation insulating pattern 182" may be in contact with the gate electrode 165. A portion of a side surface of the second isolation insulating pattern 182" may be in contact with the gate electrode 165 of the gate structures 160 and with the capping layer 166. This may be because the second isolation insulating pattern 182" is formed in the opening having a relatively large width as compared to FIG. 2C. The opening may remove the spacer structure 164 and may expose the gate electrode 165, and the second isolation insulating pattern 182" may be in contact with the exposed gate electrode 165.

FIG. 6 is a cross-sectional diagram illustrating a semiconductor device **100*d* according to an example embodiment. FIG. 7A is a cross-sectional diagram taken along line V-V' in FIG. 6, and FIG. 7B is a cross-sectional diagram taken along line VI-VI'. Only the main components of the semiconductor device are illustrated in FIGS. 6 to 7**B for ease of description.

Referring to FIGS. 6 to 7B, the semiconductor device 100*d* may further include a third isolation insulating pattern 183 that isolates contact plugs 170 adjacent to each other. The semiconductor device 100*d* according to the example embodiments may further include a third isolation insulating pattern 183 disposed in one region of the semiconductor device 100 in FIGS. 1 to 2C.

The active regions 105 may include fifth and sixth active regions 105*e* and 105*f* extending in a first horizontal direction, spaced apart from each other in a second horizontal direction, and extending in parallel to each other. The source/drain regions 150 may include a fifth source/drain region 150*e* disposed on the fifth active region 105*e* and a sixth source/drain region 150*f* disposed on the sixth active region 105*f*. The contact plugs 170 may include a fifth contact plug 170*e* connected to a fifth source/drain region 150*e* and a sixth contact plug connected to a sixth source/drain region 150*f* between the gate structures 160 adjacent to each other.

The third isolation insulating pattern 183 may isolate the fifth and sixth contact plugs 170*e* and 170*f*. The third isolation insulating pattern 183 may be an insulating pattern in which an insulating material is filled in a line-shaped trench. The third isolation insulating pattern 183 may extend in the first horizontal direction parallel to the active regions 105.

The third isolation insulating pattern 183 may penetrate through a plurality of gate structures 160 adjacent to each other (e.g., a plurality of adjacent gate structures). Accordingly, the gate structures 160 may include first isolation gate structures 160S1 and second isolation gate structures 160S2 spaced apart from the first isolation gate structures 160S1 in the second horizontal direction by the third isolation insulating pattern 183.

The third isolation insulating pattern 183 may include the same material as that of the second isolation insulating pattern 182 (see FIG. 2C). The third isolation insulating pattern 183 may have substantially the same length as the second length L2 of the second isolation insulating pattern 182. A lower surface of the third isolation insulating pattern 183 may be disposed on substantially the same level as a level of a lower surface of the second isolation insulating pattern 182. A lower surface of the third isolation insulating pattern 183 may be disposed on a level lower than a level of the source/drain regions 150. The third isolation insulating pattern 183 may be in contact with the source/drain regions 150 and/or the device isolation layers 107. This may be because the third isolation insulating pattern 183 is formed through the same etching process as the second isolation insulating pattern 182.

In the semiconductor device 100*d* according to an example embodiment, the isolation insulating patterns 180 may further include the third isolation insulating pattern 183 together with the first and second isolation insulating patterns 181 and 182 in FIGS. 1 to 2C, but an example embodiment thereof is not limited thereto, and only the first and third isolation insulating patterns 181 and 183 may be included in example embodiments.

FIG. 8 is a cross-sectional diagram illustrating a semiconductor device 100*e* according to an example embodiment.

Referring to FIG. 8, the semiconductor device 100*e* may further include a fourth isolation insulating pattern 184 isolating contact plugs 170 adjacent to each other. The semiconductor device 100*e* according to the example embodiments may further include a fourth isolation insulating pattern 184 disposed in one region of the semiconductor device 100 in FIGS. 1 to 2C.

The fourth isolation insulating pattern 184 may isolate the seventh and eighth contact plugs 170*g* and 170*h* adjacent to each other.

The fourth isolation insulating pattern 184 may be configured as an insulating pattern in which a dam-shaped opening surrounding the closed space is filled with an insulating material to allow a specific closed space to be distinct.

In an example embodiment, the fourth isolation insulating pattern 184 may surround a plurality of active regions 105 adjacent to each other among the active regions 105 (e.g., a plurality of adjacent active regions) and a plurality of gate structures 160 intersecting the plurality of active regions 105 among the gate structures 160. In an example embodiment, the number of the plurality of active regions 105 may be two and the number of the plurality of gate structures 160 may be four, but the number of the plurality of active regions 105 and the number of the plurality of gate structures 160 are not limited thereto.

The fourth isolation insulating pattern 184 may include the same material as that of the second isolation insulating pattern 182 (see FIG. 2C). The fourth isolation insulating pattern 184 may have substantially the same length as the second length L2 of the second isolation insulating pattern 182. The lower surface of the fourth isolation insulating pattern 184 may be disposed on substantially the same level as that of the lower surface of the second isolation insulating pattern 182. A lower surface of the fourth isolation insulating pattern 184 may be disposed on a level lower than a level of that of the source/drain regions 150. The fourth isolation insulating pattern 184 may be in contact with the source/drain regions 150 and/or the device isolation layers 107.

This may be because the fourth isolation insulating pattern 184 is formed through the same etching process as the second isolation insulating pattern 182.

In the semiconductor device 100*e* according to the example embodiment, the isolation insulating patterns 180 may further include the fourth isolation insulating pattern 184 together with the first and second isolation insulating patterns 181 and 182 in FIGS. 1 to 2C, but an example embodiment thereof is not limited thereto, and in example embodiments, the isolation insulating patterns 180 may only include the first and fourth isolation insulating patterns 181 and 184 or may further include the third isolation insulating pattern 183 in FIG. 7.

FIGS. 9A to 13B are diagrams illustrating processes of a method of manufacturing a semiconductor device in order according to an example embodiment, illustrating an example of a method of manufacturing a semiconductor device in FIGS. 1 to 2C.

FIGS. 9A, 10A, 11A, and 12A are cross-sectional diagrams corresponding to a region taken along line I-I' in FIG. 1. FIGS. 9B, 10B, and 13A are cross-sectional diagrams corresponding to a region taken along line II-II' in FIG. 1. FIGS. 9C, 11B, 12B, and 13B are cross-sectional diagrams corresponding to regions taken along lines III-III' and IV-IV' in FIG. 1.

Figure 9A:
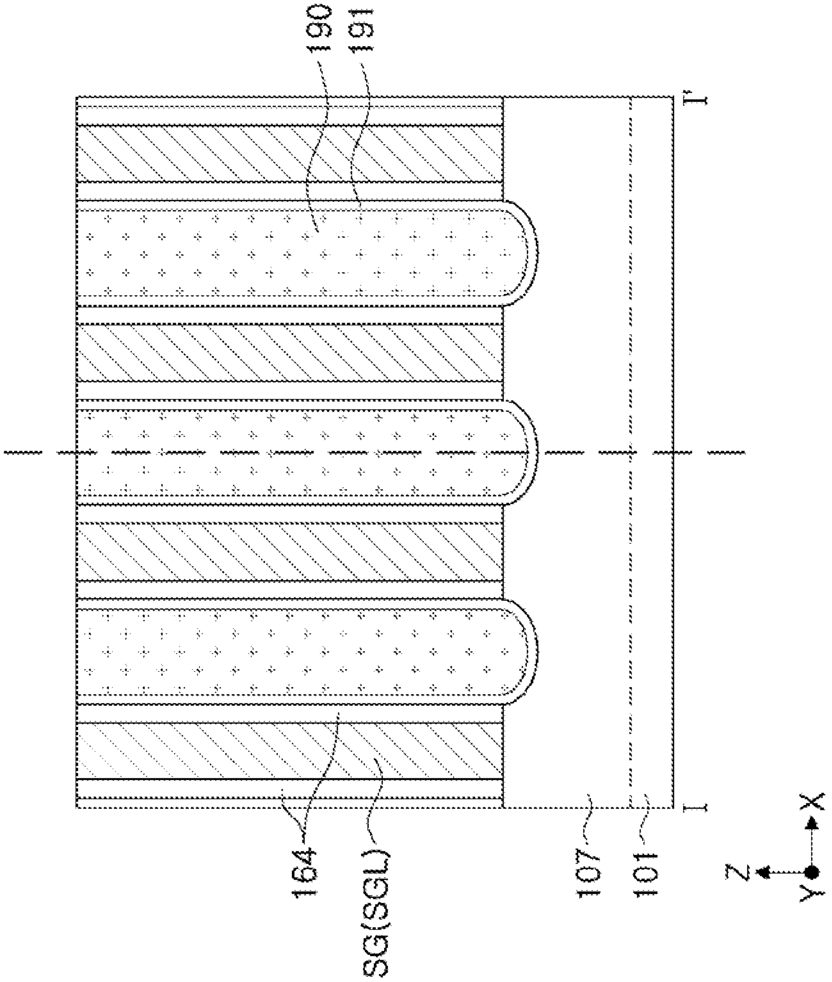
FIGS. 9A to 9C, 10A, 10B, 11A, 11B, 12A, 12B, 13A, and 13B are diagrams illustrating processes of a method of manufacturing a semiconductor device according to an example embodiment.
Figure 9B:
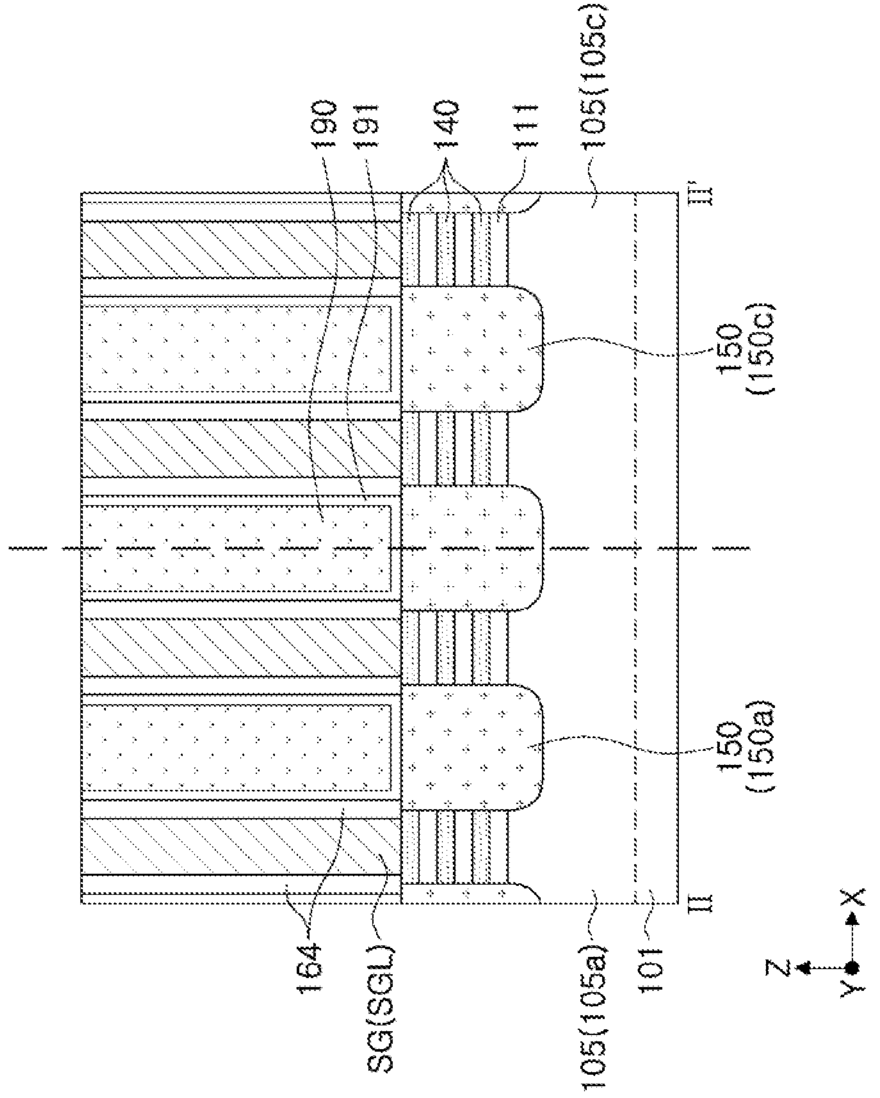
Figure 9C:
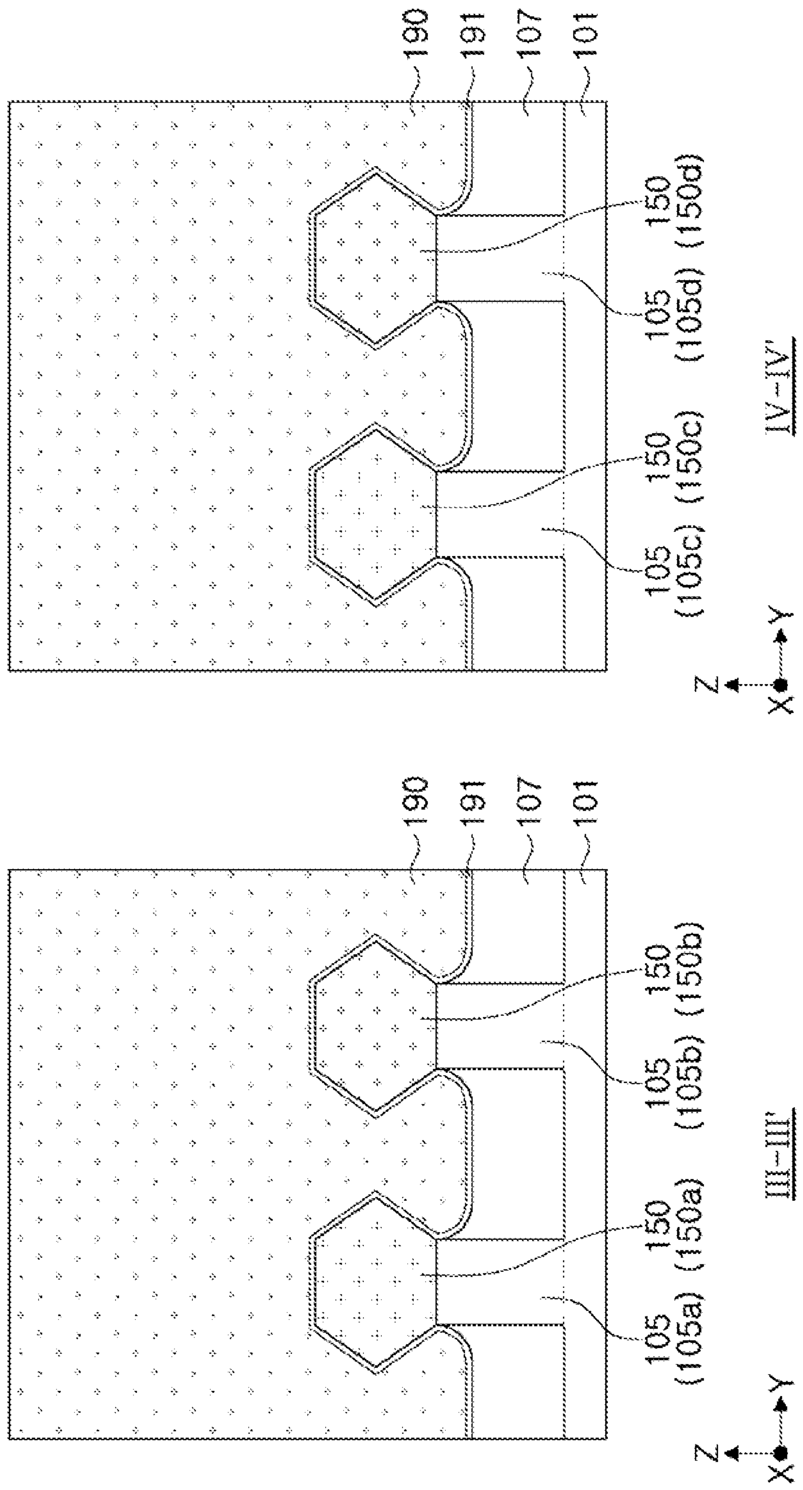

Referring to FIGS. 9A, 9B, and 9C, active regions 105 may be formed on a substrate 101, sacrificial gate structures SG intersecting the active regions 105 may be formed, source/drain regions 150 may be formed, an interlayer insulating layer 190 may be formed, the sacrificial gate structures SG may be removed, and gate structures 160 may be formed.

Sacrificial layers 111 and channel layers 140 alternately stacked on the substrate 101 may be formed, and a trench defining the active regions 105 may be formed by at least a portion of the sacrificial layers 111, the channel layers 140, and the substrate 101. The sacrificial layers 111 and the channel layers 140 may be formed by an epitaxial growth process. The sacrificial layers 111 may be formed of a material having etch selectivity with respect to the channel layers 140. The sacrificial layers 111 and the channel layers 140 may include, for example, a semiconductor material including at least one of silicon (Si), silicon germanium (SiGe), and germanium (Ge), and may include different materials. The sacrificial layers 111 may include, for example, silicon germanium (SiGe), and the channel layers 140 may include silicon (Si).

The active regions 105 may be defined by the trench. The active regions 105 may be formed to protrude to the upper surface of the substrate 101 by removing a portion of the substrate 101. The active regions 105 may have a shape protruding in the z-direction, which may be a direction perpendicular to the substrate 101, and may be formed of the same material as that of the substrate 101. The active regions 105 may be formed in a line shape extending in a first horizontal direction (e.g., x-direction), and may be spaced apart from each other in a second horizontal direction (e.g., y direction). In an example embodiment, the active regions 105 may include first and second active regions 105*a* and 105*b*, and third and fourth active regions 105*c* and 105*d*, spaced apart from each other in they direction.

The device isolation layers 107 may be formed in the region from which the substrate 101 is partially removed by filling the insulating material therein and partially removing the insulating material to allow the active regions 105 to protrude. The device isolation layers 107 may cover a portion of side surfaces of the active regions 105. A level of an upper surface of the device isolation layers 107 may be lower than a level of an upper surface of the active regions 105. The device isolation layers 107 may include silicon oxide.

Thereafter, the sacrificial gate structures SG intersecting the active regions 105 and parallel to each other may be formed. Each of the sacrificial gate structures SG may have a line shape extending in one direction, that is, for example, the y direction. The sacrificial gate structures SG may be sacrificial structures formed in a region in which the gate dielectric layer 162 and the gate electrode 165 are disposed on the channel layers 140 through a subsequent process. The sacrificial gate structures SG may include a sacrificial gate layer SGL and a sacrificial gate capping layer stacked in order. The sacrificial gate layer SGL may be formed of, for example, polysilicon, and the sacrificial gate capping layer may be formed of a silicon nitride layer. However, the structure and material of the sacrificial gate structures SG may be varied.

Spacer structures 164 may be formed on both sidewalls of the sacrificial gate structures SG. The spacer structure 164 may be formed by forming a film having a uniform thickness along the upper and side surfaces of the sacrificial gate structures SG and the upper surface of the active regions 105 and performing an anisotropic etching process. The spacer structure 164 may include an insulating material, such as, for example, at least one of SiO, SiN, SiCN, SiOC, SiON, and SiOCN.

Thereafter, the active regions 105 may be exposed by etching portions of the sacrificial layers 111 and the channel layers 140 using the sacrificial gate structures SG and the spacer structure 164 as an etch mask, and the source/drain regions 150 may be formed on the exposed active regions 105.

A recess portion may be formed by removing the exposed sacrificial layers 111 and the channel layers 140 between the sacrificial gate structures SG, and the active regions 105 may be exposed. A portion of the substrate 101 may be recessed by forming the recess portion deeply, but an example embodiment thereof is not limited thereto, and the recess portion may be recessed such that a lower surface of the recess portion may be in contact with the substrate 101.

The source/drain regions 150 may be formed by performing an epitaxial growth process in the recess portion. The source/drain regions 150 may include impurities by, for example, in-situ doping.

Thereafter, the insulating liner 191 and the interlayer insulating layer 190 may be formed in order, and a planarization process may be performed until the sacrificial gate layer SGL is exposed.

The insulating liner 191 may cover the sacrificial gate structures, the spacer structure 164, the source/drain regions 150, and the device isolation layers 107. The interlayer insulating layer 190 may cover a side surface and an upper surface of the insulating liner 191. The interlayer insulating layer 190 may be formed of silicon oxide or a low dielectric material, and the insulating liner 191 may be formed of a material different from that of the interlayer insulating layer 190, such as, for example, silicon nitride or a silicon nitride-based insulating material. A portion of the spacer structure 164 and the sacrificial gate capping layer may be removed through the planarization process.

Figure 10A:
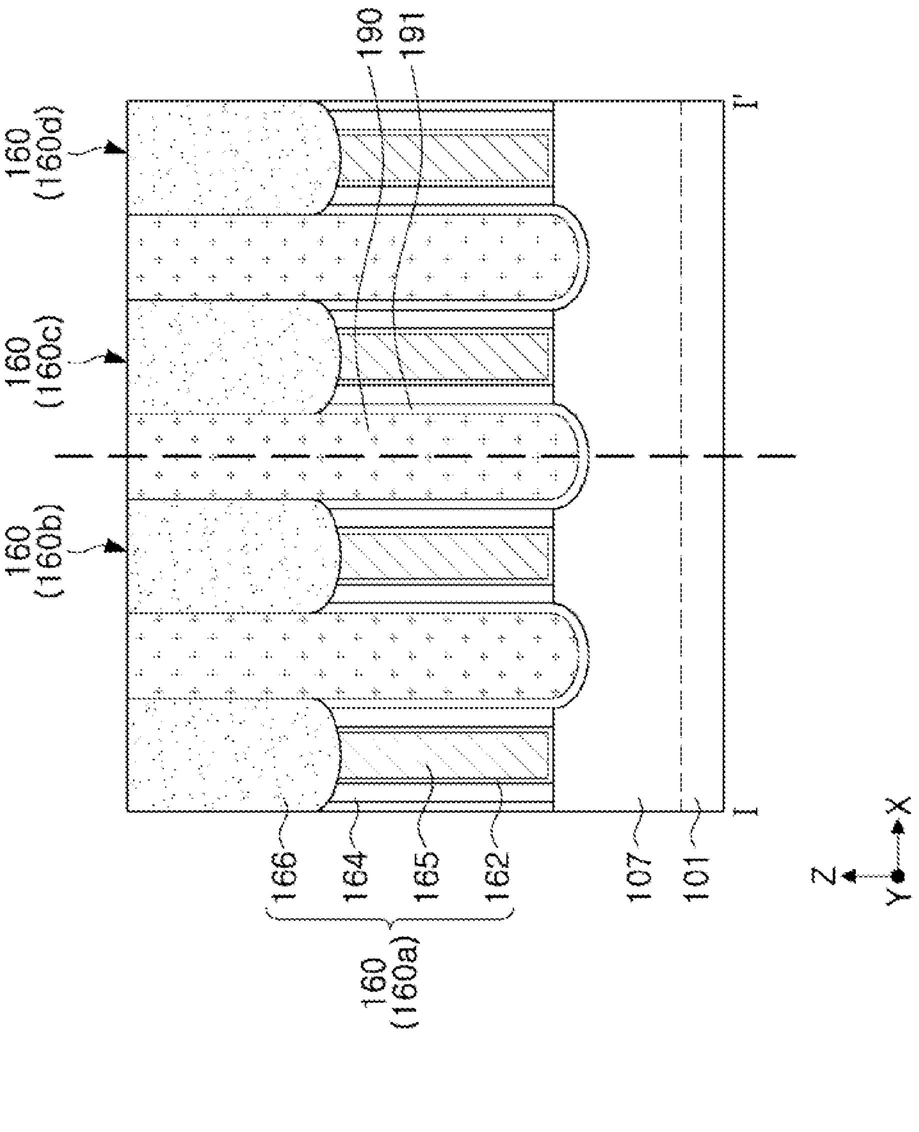
Figure 10B:
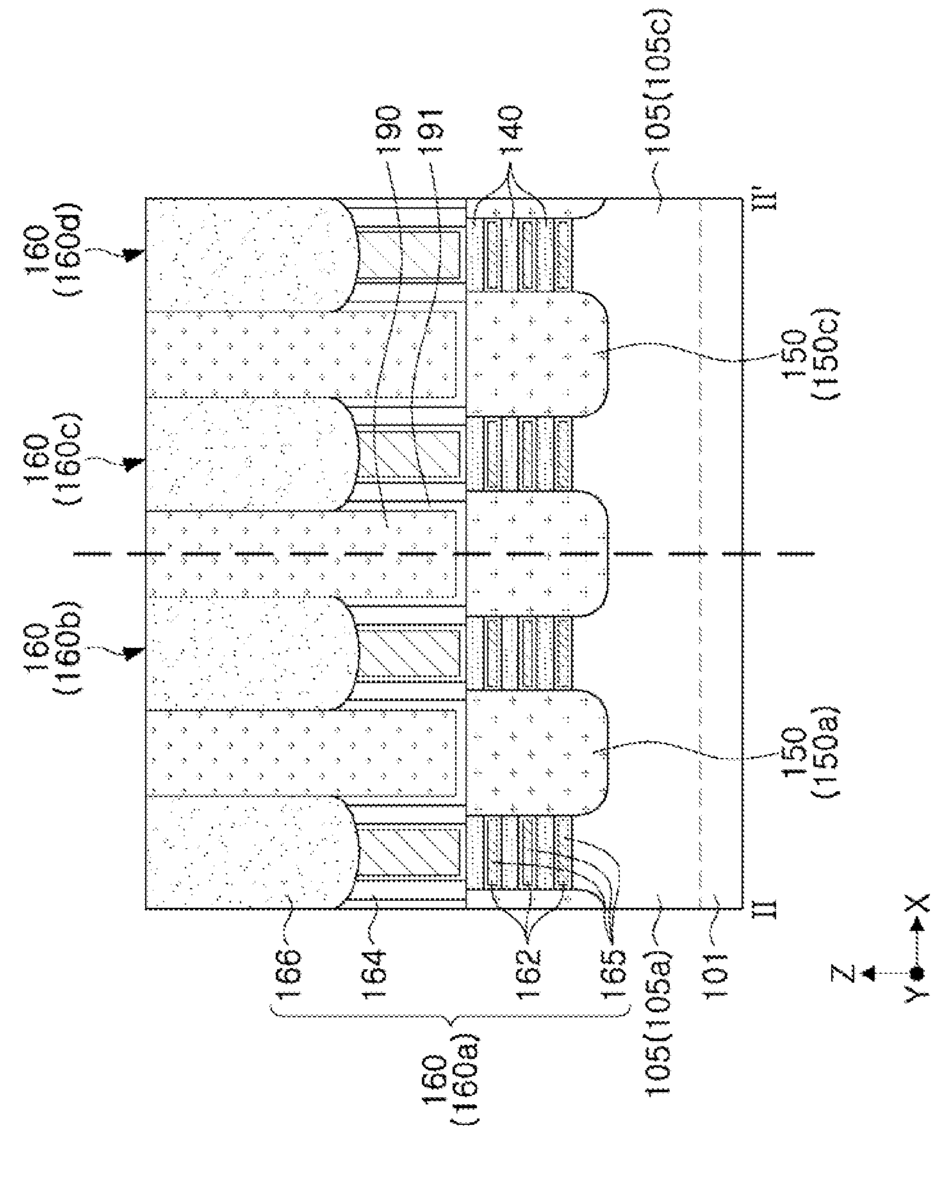

Referring to FIGS. 10A and 10B, the sacrificial layers 111 and the sacrificial gate structures SG may be removed and the gate structures 160 may be formed.

The sacrificial layers 111 and the sacrificial gate structures may be selectively removed with respect to the spacer structure 164, the interlayer insulating layer 190, and the channel layers 140. First, upper gap regions may be formed by removing the sacrificial gate layer SGL exposed through the planarization process, and lower gap regions may be formed by removing the sacrificial layers 111 exposed through the upper gap regions. For example, when the sacrificial layers 111 include silicon germanium (SiGe) and the channel layers 140 include silicon (Si), the sacrificial layers 111 may be selectively removed by performing a wet etching process using peracetic acid as an etchant.

A gate dielectric layer 162 and a gate electrode 165 may be formed in order in the upper gap region and the lower gap region. The gate dielectric layer 162 may be formed to conformally cover internal surfaces of the upper gap regions and the lower gap regions. The gate electrode 165 may be formed by entirely filling the upper gap regions and the lower gap regions.

The capping layer 166 may be formed by lowering the level of the upper surface by partially etching from the upper portion of the gate electrode 165 and the upper portion of the spacer structure 164 by a predetermined depth, filling an insulating material in the space formed as the upper surface is lowered, and performing a planarization process. The planarization process may be performed such that the upper surface of the interlayer insulating layer 190 may be exposed, but in example embodiments, a portion of the upper surface of the interlayer insulating layer 190 may be recessed. The capping layer 166 may be formed of silicon nitride or a silicon nitride-based insulating material. Accordingly, each of the gate structures 160 including the gate dielectric layer 162, the spacer structure 164, the gate electrode 165, and the capping layer 166 may be formed. In an example embodiment, the gate structures 160 may include first and second gate structures 160*a* and 160*b* intersecting the first and second active regions 105*a* and 105*b*, wherein the first and second gate structures 160*a* and 160*b* are spaced apart from each other and extend in parallel to each other. Also, the gate structures 160 may include third and fourth gate structures 160*c* and 160*d* intersecting the third and fourth active regions 105*c* and 105*d*, wherein the third and fourth gate structures 160*c* and 160*d* are spaced apart from each other and extend in parallel to each other.

Figure 11A:
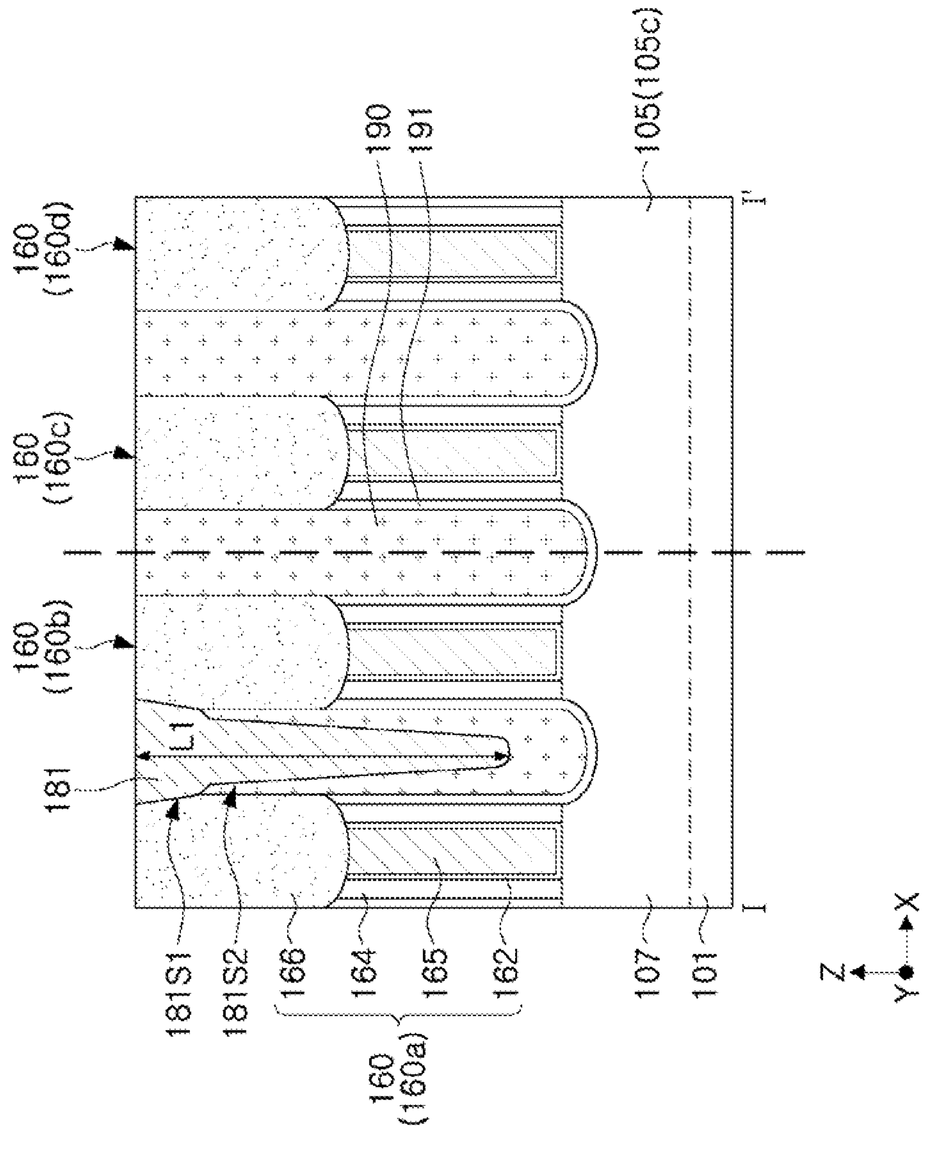
Figure 11B:
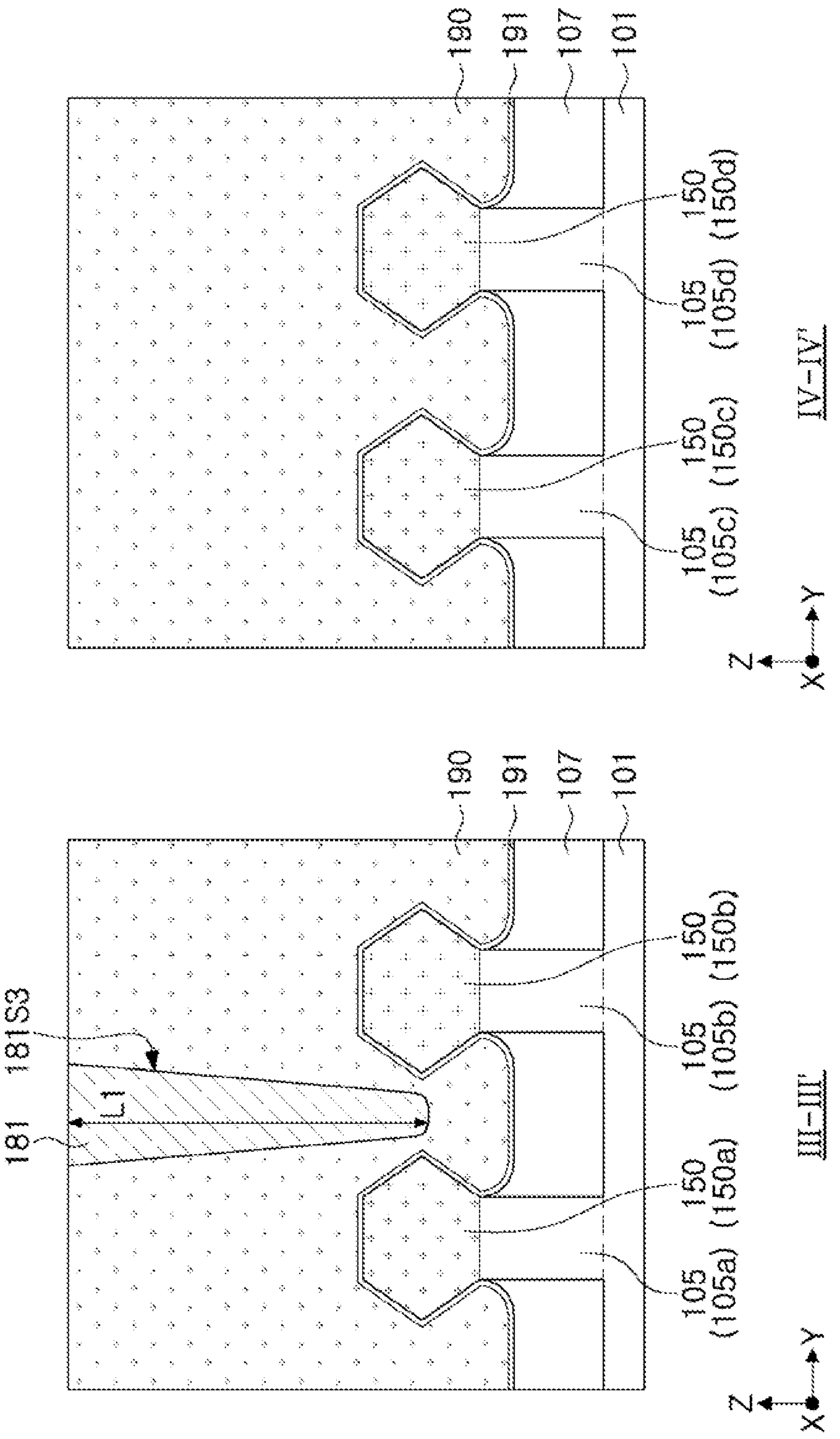

Referring to FIGS. 11A and 11B, a first isolation insulating pattern 181 may be formed.

The first isolation insulating pattern 181 may be formed by forming an opening penetrating the interlayer insulating layer 190 on the device isolation layers 107 between the first and second gate structures 160*a* and 160*b* and filling the opening with an insulating material. The insulating material may include oxide, nitride, carbide, or a combination thereof, and may include, for example, silicon nitride. The opening may be formed by performing a patterning process, such as an exposure process, on a region corresponding to the opening, and performing an etching process. The etching process may be, for example, a dry etching process. In an example embodiment, the etching process may be a process of selectively removing the interlayer insulating layer 190 with respect to the gate structures 160 under a specific etching condition. In the etching process, a portion of the capping layer 166 may be removed even in a process having an etch selectivity. Alternatively, in example embodiments, the capping layer 166 may not be removed.

As the planarization process is performed after filling the opening with an insulating material, the upper surface of the first isolation insulating pattern 181 may be substantially coplanar with the upper surface of the capping layer 166. The first isolation insulating pattern 181 may have a first length L1 in the z direction. A lower surface of the first isolation insulating pattern 181 may be disposed on a level higher than a level of lower surfaces of the source/drain regions 150. This may be because the first isolation insulating pattern 181 may be a region corresponding to the opening having a relatively small width and extending by a thin depth by the etching process having the etch selectivity. As the first isolation insulating pattern 181 is formed by an etching process having the etch selectivity, the first isolation insulating pattern 181 may not affect electrical properties of the adjacent gate structures 160.

Figure 12A:
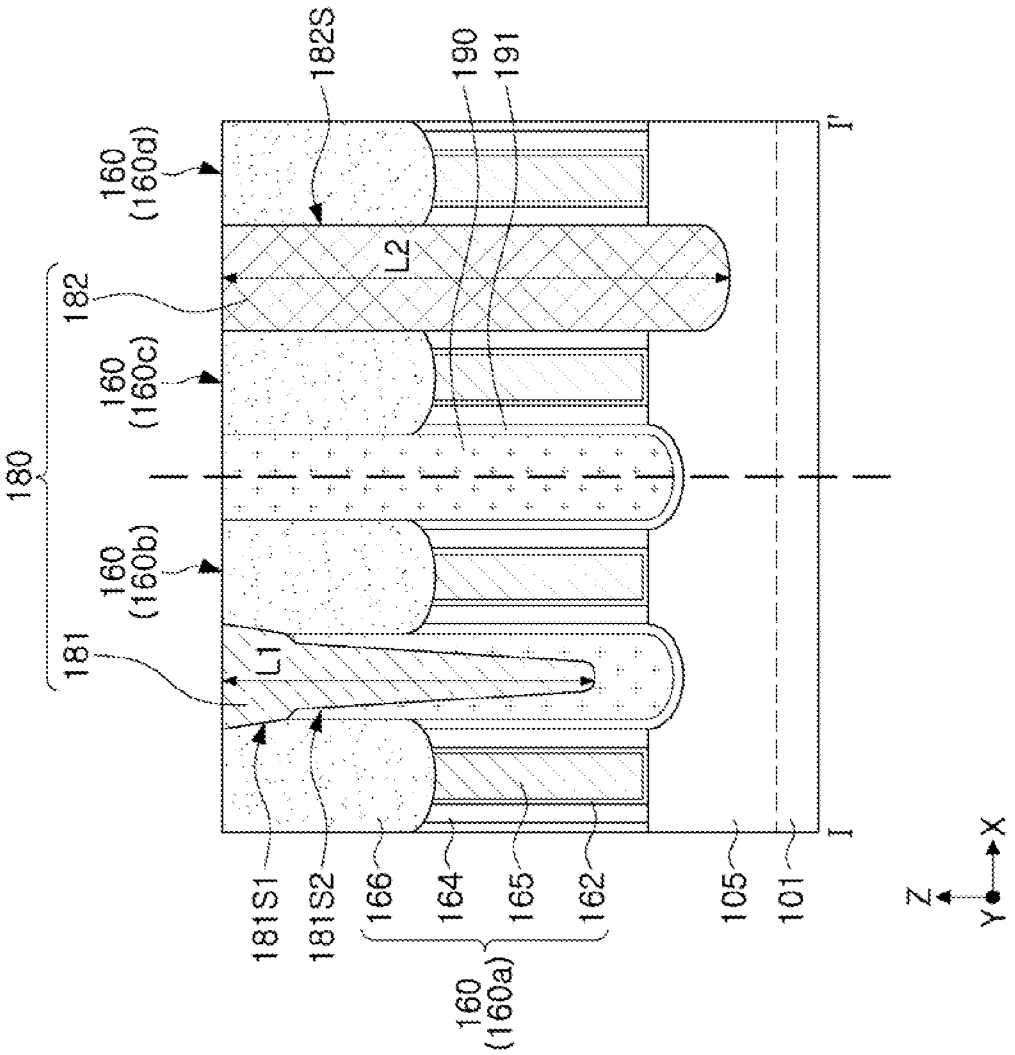
Figure 12B:
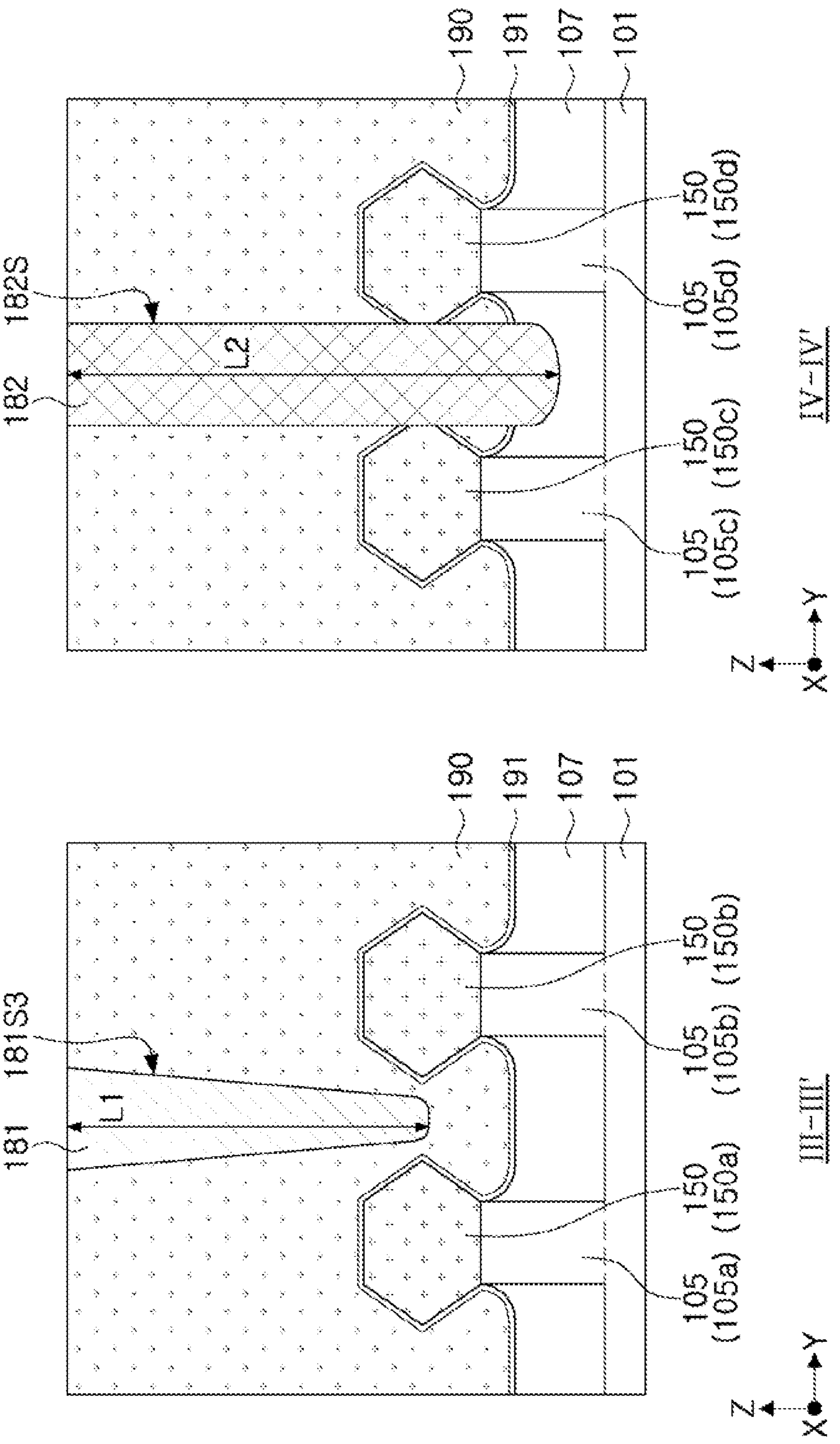
Figure 13A:
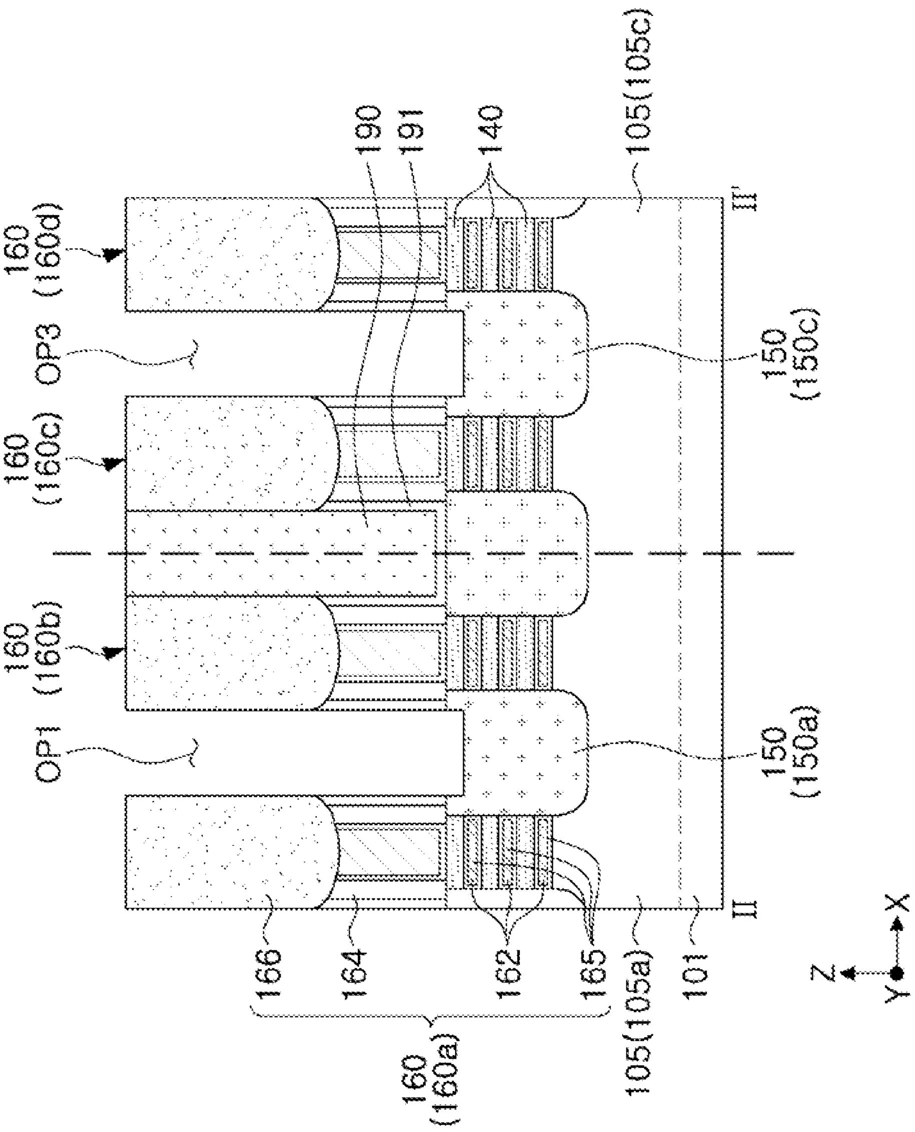

Referring to FIGS. 12A and 12B, a second isolation insulating pattern 182 may be formed.

The second isolation insulating pattern 182 may be formed by forming an opening penetrating the interlayer insulating layer 190 on the device isolation layers 107 between the third and fourth gate structures 160*c* and 160*d*, and filling the opening with an insulating material. The insulating material may include oxide, nitride, carbide, or a combination thereof, such as, for example, silicon nitride. The second isolation insulating pattern 182 may include an insulating material different from that of the first isolation insulating pattern 181, but an example embodiment thereof is not limited thereto and the first isolation insulating pattern 181 and the second isolation insulating pattern 182 may include the same insulating material. The opening may be formed by performing a patterning process, such as an exposure process, on a region corresponding to the opening, and performing an etching process. The etching process may be, for example, a dry etching process. In an example embodiment, the etching process may be performed to form the opening by anisotropic etching without an etching selectivity. Accordingly, the etching process may remove at least a portion of the insulating liner 191 and the spacer structure 164 together with the interlayer insulating layer 190. Also, in an example embodiment, the etching process may remove a portion of the source/drain regions 150 (see, e.g., FIG. 12B).

As the planarization process is performed after filling the opening with an insulating material, the upper surface of the second isolation insulating pattern 182 may be substantially coplanar with the upper surface of the capping layer 166. The second isolation insulating pattern 182 may have a second length L2 in the z direction. A lower surface of the second isolation insulating pattern 182 may be disposed on a level lower than a level of the lower surface of the source/drain regions 150. This may be because the second isolation insulating pattern 182 may be a region corresponding to an opening having a relatively large width and extending by a deep depth by an etching process without an etching selectivity. As the second isolation insulating pattern 182 is formed by an etching process without an etching selectivity, the second isolation insulating pattern 182 may extend by a deep depth such that leakage current caused by contact between adjacent contact plugs 170 formed through a subsequent process may be prevented or addressed.

In an example embodiment, as described with reference to FIGS. 11A to 12B, the first isolation insulating pattern 181 may be formed, and the second isolation insulating pattern 182 may be formed thereafter, or alternatively, the first and second isolation insulating patterns 181 and 182 may be formed by forming an opening corresponding to the first isolation insulating pattern 181, forming an opening corresponding to the second isolation insulating pattern 182, and filling an insulating material simultaneously. In this case, the first and second isolation insulating patterns 181 and 182 may include the same insulating material.

Figure 13B:
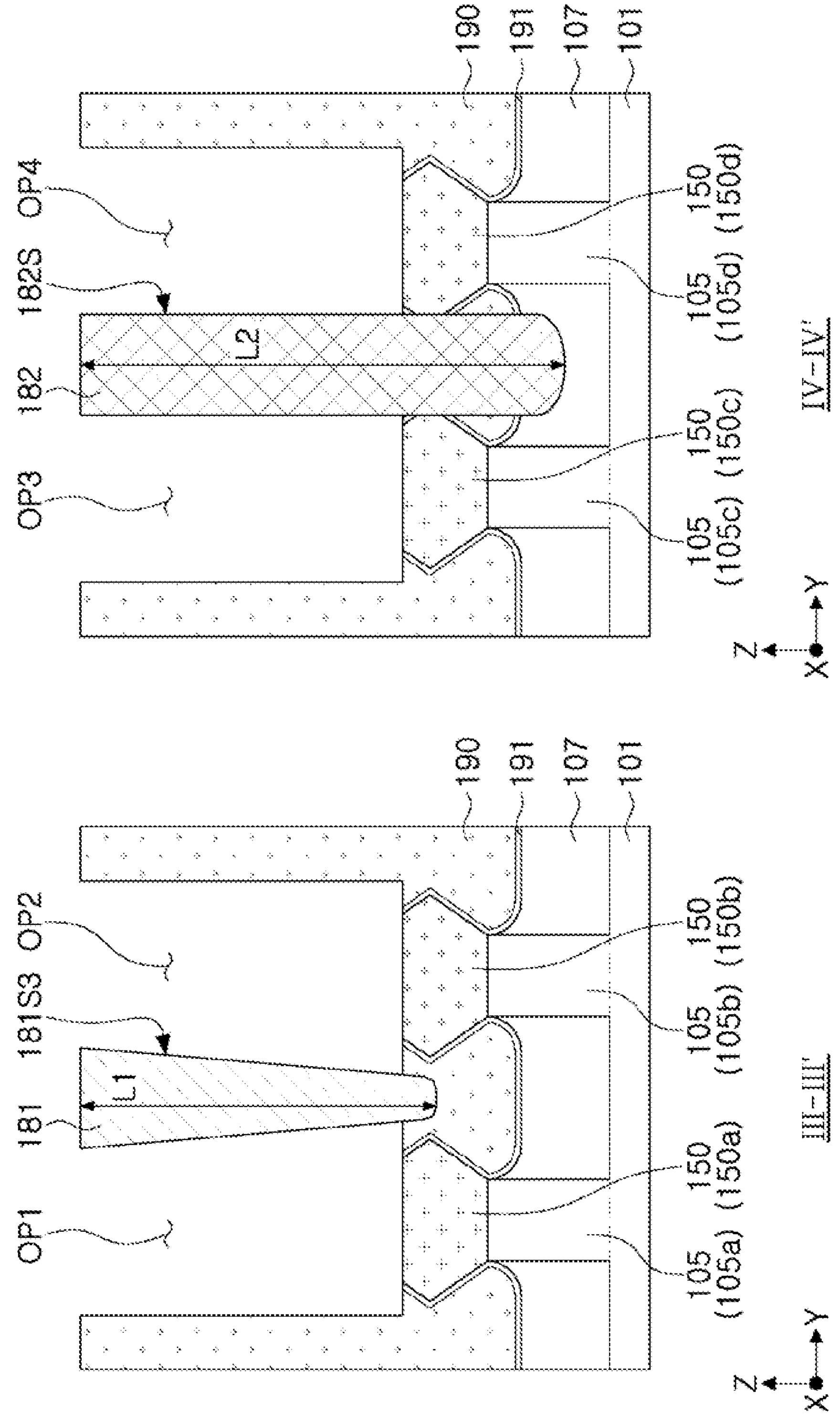

Referring to FIGS. 13A and 13B, contact openings OP1, OP2, OP3, and OP4 may be formed.

The contact openings OP1, OP2, OP3, and OP4 penetrating the interlayer insulating layer 190 and exposing the source/drain regions 150 may be formed by performing an etching process. The etching process may include a dry etching process or a wet etching process. The contact openings OP1, OP2, OP3, and OP4 may further extend from the source/drain regions 150 by a predetermined depth, but an example embodiment thereof is not limited thereto.

In an example embodiment, the contact openings OP1, OP2, OP3, and OP4 may be formed by etching the interlayer insulating layer 190 in a direction perpendicular to the substrate 101 along side surfaces of the capping layer 166, the first isolation insulating pattern 181, and the second isolation insulating pattern 182. Since the capping layer 166, the first isolation insulating pattern 181, and the second isolation insulating pattern 182 may include a material having strong etch resistance with respect to the interlayer insulating layer 190, the openings OP1, OP2, OP3, and OP4 may be formed without the components being etched. The capping layer 166, the first isolation insulating pattern 181, and the second isolation insulating pattern 182 may form contact openings OP1, OP2. OP3. OP4 for forming a self-aligning contact (SAC). Alternatively, the contact openings OP1, OP2, OP3, and OP4 may be formed to correspond to the patterned region through a mask patterned through an exposure process and an etching process.

In an example embodiment, the contact openings OP1, OP2, OP3, and OP4 may include a first contact opening OP1 exposing the first source/drain region 150*a*, a second contact opening OP2 exposing the second source/drain region 150*b*, a third contact opening OP3 exposing the third source/drain region 150*c*, and a fourth contact opening OP4 exposing the fourth source/drain region 150*d*.

The first and second contact openings OP1 and OP2 may be spaced apart from each other by the first isolation insulating pattern 181. The first and second contact openings OP1 and OP2 may expose a portion of a side surface of the first isolation insulating pattern 181.

The third and fourth contact openings OP3 and OP4 may be spaced apart from each other by the second isolation insulating pattern 182. The third and fourth contact openings OP3 and OP4 may expose a portion of a side surface of the second isolation insulating pattern 182.

In this process, when the first and second contact openings OP1 and OP2 are formed by a wet etching process and the openings are formed by a relatively deep depth, the first and second contact plugs 170*a*' and 170*b*' in FIG. 3 including the extension portions 170*a*_P and 170*b*_P may be formed.

Thereafter, referring to FIGS. 1 to 2C, contact plugs 170 may be formed by filling a conductive material in the contact openings OP1, OP2, OP3, and OP4 and performing a planarization process. In an example embodiment, each of the contact plugs 170 including the barrier layer 172 and the plug layer 171 may be formed by conformally forming a metal nitride layer, filling a metal material, and performing the planarization process.

According to the aforementioned example embodiments, by forming the isolation insulating patterns having different depths in different regions, a semiconductor device having improved electrical properties and productivity in which a leakage current defect between contact plugs formed through a subsequent process may be controlled may be provided.

While the example embodiments have been illustrated and described above, it will be configured as apparent to those skilled in the art that modifications and variations could be made without departing from the scope of the present disclosure as defined by the appended claims.

What is claimed is:

1. A semiconductor device, comprising:

a substrate;

active regions extending in a first horizontal direction on the substrate, wherein the active regions comprise a first active region and a second active region spaced apart from each other in a second horizontal direction perpendicular to the first horizontal direction, and a third active region and a fourth active region spaced apart from each other in the second horizontal direction;

gate structures comprising a first gate structure, a second gate structure, a third gate structure, and a fourth gate structure, wherein the first gate structure and the second gate structure intersect the first active region and the second active region and are spaced apart from each other in the first horizontal direction, and wherein the third gate structure and the fourth gate structure intersect the third active region and the fourth active region and are spaced apart from each other in the first horizontal direction;

source/drain regions comprising a first source/drain region on the first active region between the first gate structure and the second gate structure, a second source/drain region on the second active region between the first gate structure and the second gate structure, a third source/drain region on the third active region between the third gate structure and the fourth gate structure, and a fourth source/drain region on the fourth active region between the third gate structure and the fourth gate structure;

contact plugs comprising a first contact plug connected to the first source/drain region, a second contact plug connected to the second source/drain region, a third contact plug connected to the third source/drain region, and a fourth contact plug connected to the fourth source/drain region;

a first isolation insulating pattern between the first contact plug and the second contact plug; and a second isolation insulating pattern between the third contact plug and the fourth contact plug, wherein a first length in a vertical direction of the first isolation insulating pattern is smaller than a second length in the vertical direction of the second isolation insulating pattern, wherein the vertical direction is perpendicular to an upper surface of the substrate.

2. The semiconductor device of claim 1, wherein the first isolation insulating pattern separates the first contact plug and the second contact plug from each other and is in contact with each of the first contact plug and the second contact plug, and wherein the second isolation insulating pattern separates the third contact plug and the fourth contact plug from each other and is in contact with each of the third contact plug and the fourth contact plug.

3. The semiconductor device of claim 1, wherein an average width of the first isolation insulating pattern is smaller than an average width of the second isolation insulating pattern in the second horizontal direction.

4. The semiconductor device of claim 1, wherein a lower surface of the first isolation insulating pattern is at a level higher than a level of a lower surface of each of the source/drain regions, and wherein a lower surface of the second isolation insulating pattern is at a level lower than the level of the lower surface of each of the source/drain regions.

5. The semiconductor device of claim 1, wherein the first isolation insulating pattern is spaced apart from the source/drain regions, and wherein the second isolation insulating pattern contacts the source/drain regions.

6. The semiconductor device of claim 1, wherein each of the gate structures comprises a gate electrode extending in one direction, a spacer structure extending in the one direction on both sidewalls of the gate electrode, and a capping layer on the gate electrode and the spacer structure, wherein the first isolation insulating pattern is spaced apart from the spacer structure of each of the gate structures, and wherein the second isolation insulating pattern contacts the spacer structure of each of the gate structures.

7. The semiconductor device of claim 6, wherein the second isolation insulating pattern contacts the gate electrode of each of the gate structures.

8. The semiconductor device of claim 1, wherein the first isolation insulating pattern comprises a first side surface having a first slope in the first horizontal direction, a second side surface having a second slope in the first horizontal direction different from the first slope, and a third side surface having a third slope in the second horizontal direction, wherein the second isolation insulating pattern comprises side surfaces in the first horizontal direction and the second horizontal direction, and wherein slopes of the side surfaces of the second isolation insulating pattern are substantially equal to each other.

9. The semiconductor device of claim 1, wherein the first contact plug and the second contact plug have a width increasing toward the substrate in the second horizontal direction, and wherein the third contact plug and the fourth contact plug have a width that is decreasing toward the substrate or is constant in the second horizontal direction.

10. The semiconductor device of claim 1, wherein each of the first contact plug and the second contact plug comprises an extension portion extending to a region between the source/drain regions and the first isolation insulating pattern.

11. The semiconductor device of claim 1, further comprising:

a third isolation insulating pattern extending in the first horizontal direction, wherein the third isolation insulating pattern penetrates through a plurality of adjacent gate structures among the gate structures, wherein the third isolation insulating pattern and the second isolation insulating pattern comprise a same material, and wherein the third isolation insulating pattern has a length in the vertical direction, substantially equal to the second length of the second isolation insulating pattern.

12. The semiconductor device of claim 1, further comprising:

a fourth isolation insulating pattern, wherein the fourth isolation insulating pattern encloses, on a plane, a plurality of adjacent active regions among the active regions and a plurality of gate structures intersecting the plurality of adjacent active regions, wherein the plurality of gate structures intersecting the plurality of adjacent active regions are adjacent to each other among the gate structures, wherein the fourth isolation insulating pattern and the second isolation insulating pattern comprise a same material, and wherein the fourth isolation insulating pattern has a length in the vertical direction, substantially equal to the second length of the second isolation insulating pattern.

13. A semiconductor device, comprising:

a substrate;

active regions extending in a first horizontal direction on the substrate, wherein the active regions comprise a first active region and a second active region spaced apart from each other in a second horizontal direction perpendicular to the first horizontal direction, and a third active region and a fourth active region spaced apart from each other in the second horizontal direction;

gate structures comprising a first gate structure, a second gate structure, a third gate structure, and a fourth gate structure, wherein the first gate structure and the second gate structure intersect the first active region and the second active region and are spaced apart from each other, and wherein the third gate structure and the fourth gate structure intersect the third active region and the fourth active region and are spaced apart from each other;

source/drain regions comprising a first source/drain region on the first active region between the first gate structure and the second gate structure, a second source/drain region on the second active region between the first gate structure and the second gate structure, a third source/drain region on the third active region between the third gate structure and the fourth gate structure, and a fourth source/drain region on the fourth active region between the third gate structure and the fourth gate structure;

contact plugs comprising a first contact plug connected to the first source/drain region, a second contact plug connected to the second source/drain region, a third contact plug connected to the third source/drain region, and a fourth contact plug connected to the fourth source/drain region;

a first isolation insulating pattern between the first contact plug and the second contact plug; and a second isolation insulating pattern between the third contact plug and the fourth contact plug, wherein the first isolation insulating pattern is spaced apart from the first source/drain region and the second source/drain region, wherein the second isolation insulating pattern contacts the third source/drain region and the fourth source/drain region, and wherein a bottommost surface of the first isolation insulating pattern is at a level higher than a level of a bottommost surface of the second isolation insulating pattern.

14. The semiconductor device of claim 13, wherein the first isolation insulating pattern comprises a plurality of side surfaces having different slopes, and wherein the second isolation insulating pattern comprises a plurality of side surfaces having one slope.

15. The semiconductor device of claim 13, wherein the first isolation insulating pattern and the second isolation insulating pattern comprise different materials from each other.

16. The semiconductor device of claim 13, wherein the first isolation insulating pattern is between the first source/drain region and the second source/drain region, and wherein the second isolation insulating pattern is between the third source/drain region and the fourth source/drain region.

17. A semiconductor device, comprising:

a substrate;

active regions extending in a first horizontal direction on the substrate, wherein the active regions comprise a first active region, a second active region, a third active region, and a fourth active region spaced apart from each other;

source/drain regions comprising a first source/drain region on the first active region, a second source/drain region on the second active region, a third source/drain region on the third active region, and a fourth source/drain region on the fourth active region;

contact plugs comprising a first contact plug connected to the first source/drain region, a second contact plug connected to the second source/drain region, a third contact plug connected to the third source/drain region, and a fourth contact plug connected to the fourth source/drain region;

a first isolation insulating pattern between the first contact plug and the second contact plug; and a second isolation insulating pattern between the third contact plug and the fourth contact plug, wherein the first isolation insulating pattern has a side surface profile different from a side surface profile of the second isolation insulating pattern.

18. The semiconductor device of claim 17, wherein the first active region and the second active region are spaced apart from each other in a second horizontal direction, wherein the first isolation insulating pattern has a first side surface having a first slope in the first horizontal direction, a second side surface having a second slope in the first horizontal direction different from the first slope, and a third side surface having a third slope in the second horizontal direction, and wherein the second isolation insulating pattern has side surfaces having substantially a same slope in the first horizontal direction and the second horizontal direction.

19. The semiconductor device of claim 17, further comprising:

a plurality of channel layers vertically spaced apart from each other on the active regions; and gate structures extending by intersecting the active regions and the plurality of channel layers on the substrate, wherein the source/drain regions contact the plurality of channel layers.

* * * * *